(12) United States Patent
Matsumoto et al.

(10) Patent No.: US 10,720,465 B2
(45) Date of Patent: Jul. 21, 2020

(54) IMAGE SENSOR AND IMAGE CAPTURE DEVICE

(71) Applicant: NIKON CORPORATION, Tokyo (JP)

(72) Inventors: Shigeru Matsumoto, Sagamihara (JP); Toru Takagi, Fujisawa (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/084,908

(22) PCT Filed: Feb. 28, 2017

(86) PCT No.: PCT/JP2017/007937
§ 371 (c)(1),
(2) Date: Oct. 31, 2018

(87) PCT Pub. No.: WO2017/169480
PCT Pub. Date: Oct. 5, 2017

(65) Prior Publication Data
US 2019/0081100 A1    Mar. 14, 2019

(30) Foreign Application Priority Data
Mar. 31, 2016 (JP) .................. 2016-070960

(51) Int. Cl.
*H01L 27/146* (2006.01)
*H04N 5/374* (2011.01)
(Continued)

(52) U.S. Cl.
CPC ...... *H01L 27/14643* (2013.01); *H01L 27/146* (2013.01); *H01L 27/1464* (2013.01);
(Continued)

(58) Field of Classification Search
CPC ......... H01L 27/14643; H01L 27/14687; H01L 27/1464; H01L 27/146; H01L 27/14636;
(Continued)

(56) References Cited

U.S. PATENT DOCUMENTS

2008/0278363 A1    11/2008    Okumura
2009/0057890 A1    3/2009    Maebashi et al.
(Continued)

FOREIGN PATENT DOCUMENTS

EP    3435658 A1    1/2019
EP    3439289 A1    2/2019
(Continued)

OTHER PUBLICATIONS

May 14, 2019 Office Action issued in Japanese Patent Application No. 2018-508833.
(Continued)

*Primary Examiner* — Hsien Ming Lee
(74) *Attorney, Agent, or Firm* — Oliff PLC

(57) ABSTRACT

A first circuit layer including a first semiconductor substrate with photoelectric conversion unit that photoelectrically converts incident light and generates charge, and a first wiring layer with wiring that reads out signal based upon charge generated by the photoelectric conversion unit; second circuit layer including a second wiring layer with wiring connected to the wiring of the first wiring layer, and a second semiconductor substrate with a through electrode connected to the wiring of the second wiring layer; third circuit layer including a third semiconductor substrate with a through electrode connected to the through electrode of the second circuit layer, and third wiring layer with wiring connected to the through electrode of the third semiconductor substrate; and a fourth circuit layer including a fourth wiring layer with wiring connected to the wiring of the third wiring layer, and fourth semiconductor substrate connected to the wiring of the fourth wiring layer.

21 Claims, 11 Drawing Sheets

(51) Int. Cl.
*H04N 5/3745* (2011.01)
*H04N 5/369* (2011.01)
*H04N 5/378* (2011.01)

(52) U.S. Cl.
CPC .. *H01L 27/14603* (2013.01); *H01L 27/14627* (2013.01); *H01L 27/14636* (2013.01); *H01L 27/14687* (2013.01); *H04N 5/374* (2013.01); *H04N 5/378* (2013.01); *H04N 5/379* (2018.08); *H04N 5/37452* (2013.01); *H04N 5/37455* (2013.01)

(58) Field of Classification Search
CPC ......... H01L 27/14632; H01L 27/14603; H01L 27/14605; H01L 27/14601; H04N 5/379
See application file for complete search history.

(56) References Cited

U.S. PATENT DOCUMENTS

| | | | |
|---|---|---|---|
| 2011/0050969 | A1 | 3/2011 | Nishihara |
| 2013/0082260 | A1* | 4/2013 | Nakamura ............... H01L 22/20 257/48 |
| 2014/0091321 | A1 | 4/2014 | Yokoyama |
| 2014/0175592 | A1 | 6/2014 | Iwabuchi et al. |
| 2014/0184844 | A1 | 7/2014 | Muto et al. |
| 2015/0189214 | A1 | 7/2015 | Kurose |
| 2015/0318320 | A1* | 11/2015 | Lin ................... H01L 27/14603 257/432 |
| 2017/0033144 | A1 | 2/2017 | Takahashi |
| 2017/0069677 | A1 | 3/2017 | Saruwatari et al. |

FOREIGN PATENT DOCUMENTS

| | | |
|---|---|---|
| JP | 2008-283556 A | 11/2008 |
| JP | 2011-071958 A | 4/2011 |
| JP | 2013-232473 A | 11/2013 |
| JP | 2013-255035 A | 12/2013 |
| JP | 2014-072418 A | 4/2014 |
| JP | 2014-131147 A | 7/2014 |
| JP | 2014-195112 A | 10/2014 |
| JP | 2015-126043 A | 7/2015 |
| WO | 2010/109815 A1 | 9/2010 |
| WO | 2015/152297 A1 | 10/2015 |
| WO | 2015/159766 A1 | 10/2015 |
| WO | 2017/163774 A1 | 9/2017 |
| WO | 2017/169446 A1 | 10/2017 |

OTHER PUBLICATIONS

May 9, 2017 International Search Report issued in International Patent Application No. PCT/JP2017/007937.
Aug. 19, 2019 Search Report issued in European Patent Application No. 17774025.5.
Oct. 1, 2019 Office Action issued in Japanese Patent Application No. 2018-508833.
Itoh, Y., et. al., "4-Layer 3-D IC with a function of parallel signal processing," Microelectronic Engineering, vol. 15, No. 1-4, pp. 187-190, Oct. 1, 1991.
Feb. 6, 2020 Office Action issued in Japanese Patent Application No. 2018-508833.
May 5, 2020 Office Action issued in Indian Patent Application No. 201817040093.

* cited by examiner

IMAGE SENSOR AND IMAGE CAPTURE DEVICE

TECHNICAL FIELD

The present invention relates to an image sensor and to an image capture device.

BACKGROUND ART

An image sensor comprising a first semiconductor chip that includes photodiodes, a second semiconductor chip that includes analog/digital conversion units, and a third semiconductor chip that includes memory elements, all laminated together, is per se known (refer to Patent Document #1). However, in the prior art, it has not been possible to process the signals outputted from all of the photodiodes simultaneously at high speed.

CITATION LIST

Patent Literature

Patent Document #1: Japanese Laid-Open Patent Publication 2014-195112.

SUMMARY OF INVENTION

According to the 1st aspect of the present invention, an image sensor comprises: a first circuit layer including a first semiconductor substrate with a photoelectric conversion unit that photoelectrically converts incident light and generates charge, and a first wiring layer with wiring that reads out a signal based upon charge generated by the photoelectric conversion unit; a second circuit layer including a second wiring layer with wiring connected to the wiring of the first wiring layer, and a second semiconductor substrate with a through electrode connected to the wiring of the second wiring layer; a third circuit layer including a third semiconductor substrate with a through electrode connected to the through electrode of the second circuit layer, and a third wiring layer with wiring connected to the through electrode of the third semiconductor substrate; and a fourth circuit layer including a fourth wiring layer with wiring connected to the wiring of the third wiring layer, and a fourth semiconductor substrate connected to the wiring of the fourth wiring layer; and wherein the first circuit layer, the second circuit layer, the third circuit layer, and the fourth circuit layer are provided in that order from a side upon which light is incident.

According to the 2nd aspect of the present invention, an image sensor comprises: a first circuit layer including a first semiconductor substrate with a photoelectric conversion unit that photoelectrically converts incident light and generates charge, and a first wiring layer with wiring that reads out a signal based upon charge generated by the photoelectric conversion unit; a second circuit layer including a second wiring layer with wiring connected to the wiring of the first wiring layer, and a second semiconductor substrate with a through electrode connected to the wiring of the second wiring layer; and a third circuit layer including a third semiconductor substrate with a through electrode connected to the through electrode of the second circuit layer, and a third wiring layer with wiring connected to the through electrode of the third semiconductor substrate; and wherein the first semiconductor substrate, the first wiring layer, the second wiring layer, the second semiconductor substrate, the third semiconductor substrate, and the third wiring layer are provided in that order from a side upon which light is incident.

According to the 3rd aspect of the present invention, an image sensor comprises: a first circuit layer including a first semiconductor substrate with a photoelectric conversion unit that photoelectrically converts incident light and generates charge, and a first wiring layer with wiring that reads out a signal based upon charge generated by the photoelectric conversion unit; a second circuit layer including a second wiring layer with wiring connected to the wiring of the first wiring layer, and a second semiconductor substrate with a through electrode connected to the wiring of the second wiring layer; and a third circuit layer including a third semiconductor substrate with a through electrode connected to the through electrode of the second circuit layer, and a third wiring layer with wiring connected to the through electrode of the third semiconductor substrate; and wherein the first wiring layer, the first semiconductor substrate, the second semiconductor substrate, the second wiring layer, the third wiring layer, and the third semiconductor substrate are provided in that order from a side upon which light is incident.

According to the 4th aspect of the present invention, an image capture device comprises: the image sensor according to any one of the 1st through 3rd aspects; and an image generation unit that generates image data based upon a signal from image sensor.

DESCRIPTION OF EMBODIMENTS

The First Embodiment

Figure 1:
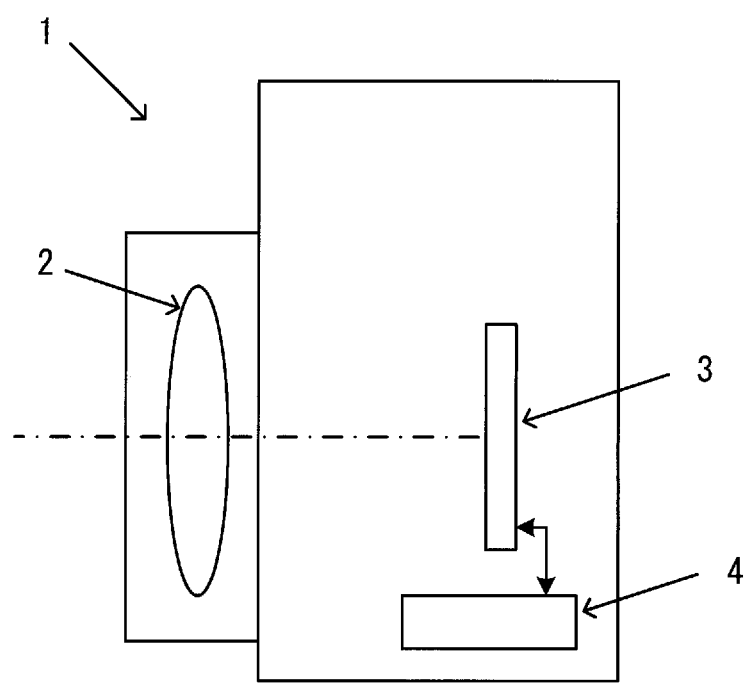
FIG. 1 is a block diagram showing the structure of an image capture device according to a first embodiment.

FIG. 1 is a block diagram showing the structure of an image capture device according to a first embodiment. The image capture device 1 comprises a photographic optical system 2, an image sensor 3, and a control unit 4. This image capture device 1 may, for example, be a camera. The photographic optical system 2 focuses an image of a photographic subject upon the image sensor 3. The image sensor 3 generates an image signal by capturing the image of the photographic subject that has been focused by the photographic optical system 2. The image sensor 3 may, for example, be a CMOS image sensor. The control unit 4 outputs a control signal to the image sensor 3 for controlling the operation of the image sensor 3. Moreover, the control unit 4 functions as an image generation unit that generates image data by performing image processing of various kinds upon the image signal outputted from the image sensor 3. It should be understood that it would also be acceptable to arrange for the photographic optical system 2 to be interchangeable from the image capture device 1.

Figure 2:
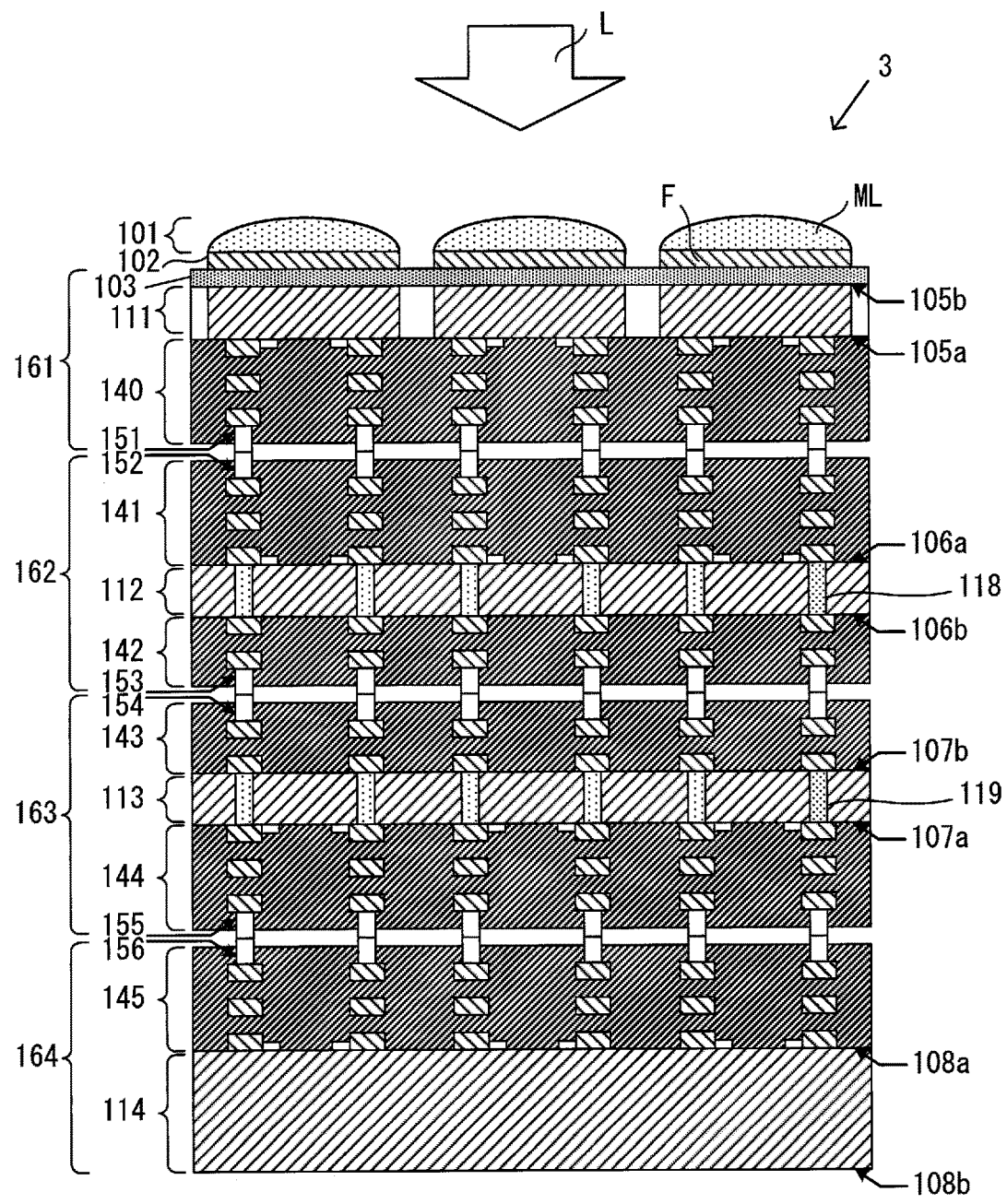
FIG. 2 is a figure showing the cross sectional structure of this image capture device according to the first embodiment.

FIG. 2 is a figure showing the cross sectional structure of this image sensor according to the first embodiment. The image sensor 3 shown in FIG. 2 is a backside-illumination type image sensor. This imaging element 3 includes a first substrate 111, a second substrate 112, a third substrate 113, and a fourth substrate 114. Each of the first substrate 111, the second substrate 112, the third substrate 113, and the fourth substrate 114 consists of a semiconductor substrate and so on. The first substrate 111 is laminated upon the second substrate 112 via a wiring layer 140 and a wiring layer 141. The second substrate 112 is laminated upon the third substrate 113 via an inter-substrate connection layer 142 and an inter-substrate connection layer 143. The third substrate 113 is laminated upon the fourth substrate 114 via a wiring layer 144 and a wiring layer 145. Light L is incident along the +Z axis direction, as shown by the outlined white arrow. Moreover, as shown by the coordinate axes, the +X axis direction is taken as being orthogonal to the Z axis and rightward on the drawing paper, while the +Y axis direction is taken as being orthogonal to the X axis direction and to the Z axis direction and outward from the drawing paper toward the viewer. In this image sensor 3, the first substrate 111, the second substrate 112, the third substrate 113, and the fourth substrate 114 are laminated together in that order along the direction of the incident light L.

The image sensor 3 further comprises a micro-lens layer 101, a color filter layer 102, and a passivation layer 103. The order in which these layers are laminated upon the first substrate 111 is: the passivation layer 103, the color filter layer 102, and the micro lens layer 101. The micro-lens layer 101 includes a plurality of micro-lenses ML. These micro-lenses ML condense incident light upon photoelectric conversion units 12 that will be described hereinafter. The color filter layer 102 includes a plurality of color filters F. And the passivation layer 103 is made from a nitride film or an oxide film.

The first substrate 111, the second substrate 112, the third substrate 113, and the fourth substrate 114 have respective first surfaces 105a, 106a, 107a and 108a upon which various electrodes such as gate electrodes and so on and gate insulation layers are formed, and respective second surfaces 105b, 106b, 107b and 108b which are different from their first surfaces. Elements of various types such as transistors having the gate electrodes mentioned above and so on are provided on each of these first surfaces 105a, 106a, 107a, and 108a. Respective wiring layers 140, 141, 144, and 145 are provided as laminated upon the first surface 105a of the first substrate 111, upon the first surface 106a of the second substrate 112, upon the first surface 107a of the third substrate 113, and upon the first surface 108a of the fourth substrate 114. Moreover, the respective inter-substrate connection layers 142 and 143 are provided as laminated upon the second surface 106b of the second substrate 112 and upon the second surface 107b of the third substrate 113. The wiring layers 140, 141, 144, and 145 and the inter-substrate connection layers 142 and 143 are layers that include conducting layers (metallic layers) and insulation layers, and wiring and vias and so on are provided therein.

Elements of various types such as transistors and so on provided upon the first surface 105a of the first substrate 111 and elements of various types such as transistors and so on provided upon the first surface 106a of the second substrate 112 are mutually electrically connected together via the wiring layers 140 and 141 by connection portions 151 and 152 such as bumps or electrodes (for example, pads) or the like. In a similar manner, elements of various types such as transistors and so on provided upon the first surface 107a of the third substrate 113 and elements of various types such as transistors and so on provided upon the first surface 108a of the fourth substrate 114 are electrically connected together via the wiring layers 144 and 145 by connection portions 155 and 156 such as bumps or electrodes or the like. Moreover, the second substrate 112 and the third substrate 113 include respective pluralities of through electrodes 118 and 119, such as silicon through electrodes or the like. The through electrodes 118 of the second substrate 112 mutually connect together circuitry provided upon the first surface 106a and upon the second surface 106b of the second substrate 112, and the through electrodes 119 of the third substrate 113 mutually connect together circuitry provided upon the first surface 107a and upon the second surface 107b of the third substrate 113. Furthermore, in surfaces (in the X-Y plane) crossing the direction of the incident light, the areas of the connection portions 153 are provided to be greater than the areas of the through electrodes 118, and the areas of the connection portions 154 are provided to be greater than the areas of the connection portions 119. Due to this, when the second substrate and the third substrate are laminated together, it is easy for the through electrodes 118 and 119 to establish electrical continuity. To put it in another manner, when the second substrate and the third substrate are laminated together, mutual positional alignment between the substrates in order for the through electrodes 118 and 119 to provide continuity can be performed in a simple manner. Circuitry that is provided upon the second surface 106b of the second substrate 112 and circuitry that is provided upon the second surface 107b of the third substrate 113 are mutually electrically connected together via the inter-substrate connection layers 142 and 143 by the connection portions 153 and 154 such as bumps or electrodes or the like. The connection portions 151 through 156 may, for example, be made from metal, and may be metallic films or the like.

The first substrate 111, the second substrate 112, the third substrate 113, and the fourth substrate 114 will also sometimes be referred to herein as the semiconductor layer, the first semiconductor layer, the second semiconductor layer, and the third semiconductor layer. The semiconductor layer 111, the wiring layer 140, the connection portions 151, and the passivation layer 103 constitute a photoelectric conversion layer 161. And the first semiconductor layer 112, the wiring layer 141, the inter-substrate connection layer 142, and the connection portions 152 and 153 constitute a first circuit layer 162. Moreover, the second semiconductor layer 113, the wiring layer 144, the inter-substrate connection layer 143, and the connection portions 154 and 155 constitute a second circuit layer 163. Furthermore, the third semiconductor layer 114, the wiring layer 145, and the connection portions 156 constitute a third circuit layer 164.

Figure 3:
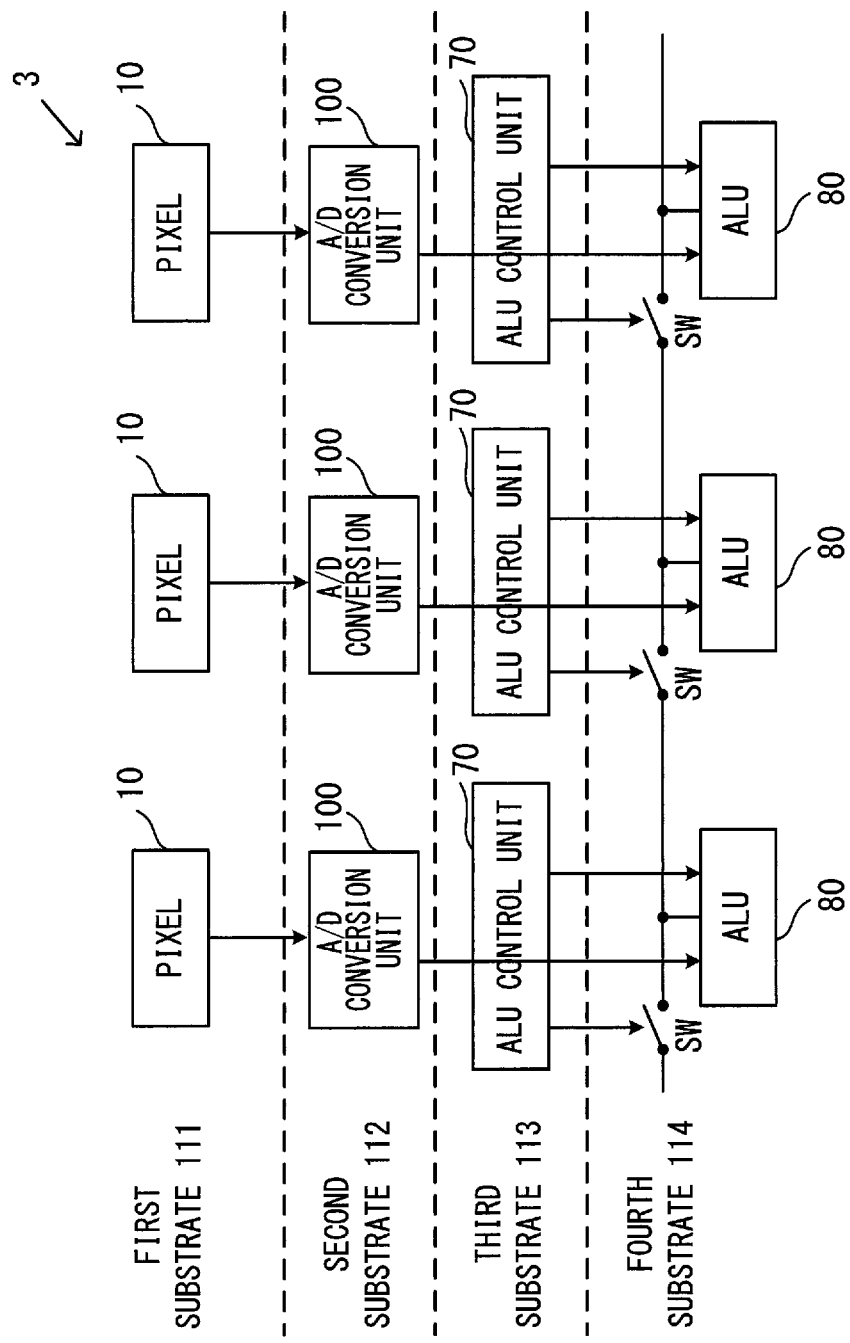
FIG. 3 is a block diagram showing the structure of an image sensor according to the first embodiment.

FIG. 3 is a block diagram showing the structure of the image sensor according to the first embodiment. The first substrate 111 comprises a plurality of pixels 10 arranged in a two dimensional array. This plurality of pixels 10 are arranged along the X axis direction and along the Y axis direction shown in FIG. 2. Each of the pixels 10 outputs a photoelectric conversion signal and a noise signal to the second substrate 112, as will be described hereinafter. The second substrate 112 comprises a plurality of analog to digital conversion units (i.e. A/D conversion units) 100. One A/D conversion unit 100 is provided for each of the pixels 10, and comprises a comparator circuit and a latch circuit and so on. Each of the A/D conversion units 100 converts the photoelectric conversion signal and the noise signal outputted from its pixel 10 repeatedly and sequentially to digital signals. The digital signals that have thus been converted by the A/D conversion units 100 are outputted to the fourth substrate 114 via the third substrate 113.

The fourth substrate comprises a plurality of ALUs (Arithmetic and Logic Units) 80, in other words a plurality of calculation units 80. One of these calculation units 80 is provided for each of the pixels 10, and they perform signal processing such as correlated double sampling by subtraction of the digital signal of the noise signal from the digital signal of the photoelectric conversion signal (CDS: Correlated Double Sampling) and calculation between the signals generated for each of the pixels 10 and so on. Each of these calculation units 80 includes an addition circuit, a subtraction circuit, a flip-flop circuit, a shift circuit, and so on. And the calculation units 80 are connected to one another via signal lines and switches SW and so on.

The third substrate 113 comprises ALU control units 70 (hereinafter these will be referred to as "control units 70") that control the calculation units 80. One of these control units 70 is provided for each of the pixels 10, and they output control signals to the calculation units 80 and to the switches SW disposed in the fourth substrate 114, and control the details of the calculations performed by the calculation units 80 and so on. For example, the control units 70 selects the signal of its pixel by controlling a predetermined one of the switches SW to on, and the calculation unit 80 corresponding to this control unit 70 performs calculation processing upon the signals of the plurality of pixels that have been selected.

Each of the pixels 10 and each of the A/D conversion units 100 includes a plurality of transistors and so on. A gate electrode of a transistor included in the pixel 10 is provided on the first surface 105a of the first substrate 111 shown in FIG. 2, and a gate electrode of a transistor included in the corresponding A/D conversion unit 100 is provided upon the first surface 106a of the second substrate 112. Furthermore, each of the control units 70 and each of the calculation units 80 includes a plurality of transistors and so on. A gate electrode of a transistor included in the control unit 70 is provided on the first surface 107a of the third substrate 113 shown in FIG. 2, and a gate electrode of a transistor included in the corresponding calculation unit 80 is provided upon the first surface 108a of the fourth substrate 114.

In this embodiment, the image sensor 3 comprises the photoelectric conversion layer 161 upon which the pixels 10 are provided, the first circuit layer 162, the second circuit layer 163, and the third circuit layer 164, all laminated together. Due to this, it is possible to dispose the circuitry and so on for processing the signals from the pixels 10 as separated between the first circuit layer 162, the second circuit layer 163, and the third circuit layer 164, which are different layers from the photoelectric conversion layer 161. As a result, it is possible to dispose a plurality of circuits and so on for processing the signals from the pixels 10, without increasing the chip area. Moreover, it is possible to prevent deterioration of the aperture ratio of the pixels 10.

The first surface 105a of the photoelectric conversion layer 161 upon which the gate electrodes are provided and the first surface 106a of the first circuit layer 162 upon which the gate electrodes are provided are stacked so as to oppose one another, and the first surface 107a of the second circuit layer 163 upon which the gate electrodes are provided and the first surface 108a of the third circuit layer 164 upon which the gate electrodes are provided are laminated so as to oppose one another. Due to this, it is possible to connect the circuitry provided to the photoelectric conversion layer 161 and the circuitry provided to the first circuit layer 162 electrically together via, for example, a plurality of bumps. Since this connection is established by bumps that can generally be formed at a narrower pitch than in the case of forming through electrodes, accordingly it is possible to transmit the large number of signals from the pixels 10 of the photoelectric conversion layer 161 simultaneously to the first circuit layer 162. In a similar manner, it is possible to transmit the large number of signals from the second circuit layer 163 simultaneously to the third circuit layer 164. In this manner, in this embodiment, as schematically shown in FIG. 2, it is possible to form a greater number of connection portions 151, 152, 155, and 156 than the number of the through electrodes 118 and 119. Furthermore, in the image sensor 3, it is possible to form a greater number of connection portions 151, 152, 155, and 156 than the number of the connection portions 153 and 154. It will be acceptable to arrange to provide a greater number of the connection portions 151 and 152 than the number of the connection portions 153 and 154, and it will be acceptable to arrange to provide a greater number of the connection portions 155 and 156 than the number of the connection portions 153 and 154. In this image sensor 3, the plurality of the connection portions 151, 152, 155, and 156 are provided and arranged according to the number of circuits and the amount of wiring provided upon the first substrate 111 through the fourth substrate 114.

In this embodiment, it is possible for each of the pixels 10 of the first substrate 111 and each of the A/D conversion units 100 of the second substrate 112 to be connected together via a plurality of bumps. Due to this, it is possible to output the signals from each of the pixels 10 simultaneously to the A/D conversion units 100, one of which is provided for each of the pixels 10. Due to this, it is possible for the A/D conversions performed by each of the A/D conversion units 100 to be performed simultaneously. Moreover, the control units 70 of the third substrate 113 supply control signals to the calculation units 80 of the fourth substrate 114 from along the Z axis direction shown in FIG. 2, so as to perform control of the calculation units 80. Due to this, it is possible to perform calculation for the signals from any desired pixels 10, without any increase of the chip area of this image sensor 3.

With the technique described in Patent Document #1, two through electrodes for connecting between circuits provided upon different substrates are matched against one another and are poked so as to be joined together. Due to this, a wide pitch is needed for forming long through electrodes that penetrate through the two substrates, and it is difficult to provide a large number of through electrodes. Furthermore, constraints upon the layouts within the substrates arise, since it is necessary to form the two through electrodes in the positions that correspond. However, in this embodiment, the circuits upon the first circuit layer 162 and the circuits upon the second circuit layer 163 are connected together via the through electrodes 118 and 119, the inter-substrate connection layers 142 and 143, and the connection portions 153 and 154. Since the through electrodes 118 and the through electrodes 119 are connected together via the inter-substrate connection layers 142 and 143 and the connection portions 153 and 154, accordingly it is possible to provide the through electrodes 118 and the through electrodes 119 in mutually different positions. Since it is not necessary to form long through electrodes that pass through the two substrates, accordingly it is possible to prevent deterioration of the yield rate for this image sensor and increase of its chip area.

Figure 4:
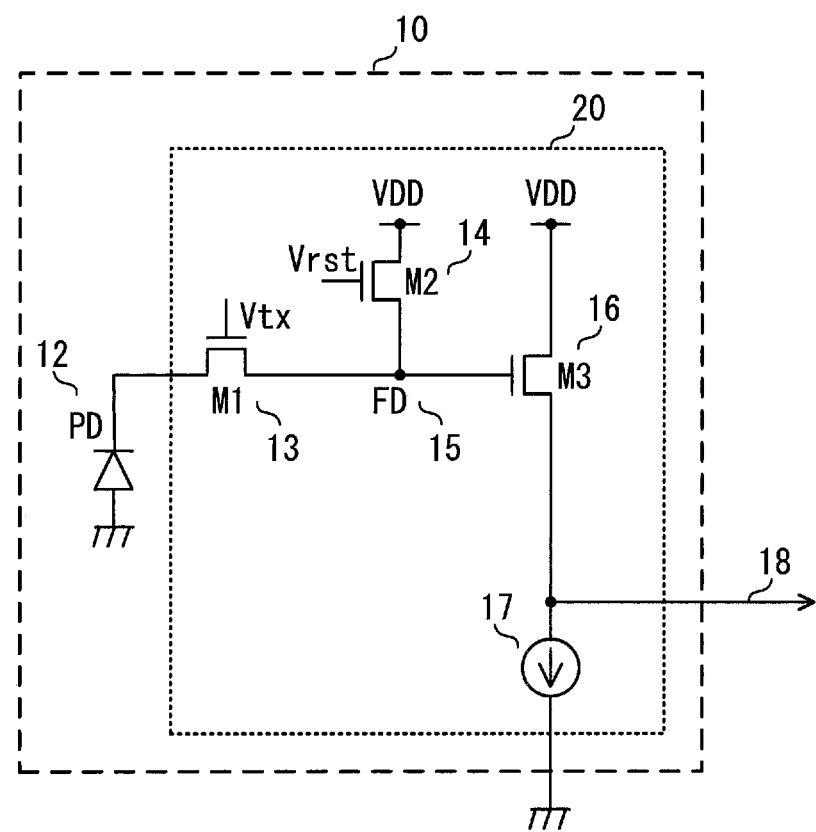
FIG. 4 is a figure showing the structure of a pixel according to the first embodiment.

FIG. 4 is a circuit diagram showing the structure of a pixel of this image sensor according to the first embodiment. This pixel 10 comprises a photoelectric conversion unit 12 such as, for example, a photodiode (PD) or the like, and a readout unit 20. The photoelectric conversion unit 12 has the function of converting incident light into charge, and of accumulating this charge that has been photoelectrically converted. And the readout unit 20 comprises a transfer unit 13, a discharge unit 14, a floating diffusion (FD) 15, an amplification unit 16, and a current source 17.

The transfer unit 13 is controlled by a signal Vtx, and transfers the charge that has been photoelectrically converted by the photoelectric conversion unit 12 to the floating diffusion 15. In other words, the transfer unit 13 defines a charge transfer path between the photoelectric conversion unit 12 and the floating diffusion 15. The floating diffusion 15 stores (i.e. accumulates) this charge. The amplification unit 16 amplifies a signal due to charge stored in the floating diffusion 15, and outputs the result to a signal line 18. In the example shown in FIG. 4, the amplification unit 16 is provided by a transistor M3 whose drain terminal, gate terminal, and source terminal are respectively connected to a power supply VDD, to the floating diffusion 15, and to a current source 17.

The discharge unit (i.e. the reset unit) 14 is controlled by a signal Vrst, and discharges the charge of the floating diffusion 15 and resets the potential of the floating diffusion 15 to a reset potential (i.e. to a reference potential). The transfer unit 13 and the discharge unit 14 may, for example, be provided by a transistor M1 and a transistor M2 respectively. The gate electrodes of the transistors M1 through M3 are provided upon the first surface 105a of the first substrate 111 shown in FIG. 2.

The readout unit 20 sequentially reads out to the signal line 18 a signal (i.e. a photoelectric conversion signal) that depends upon the charge transferred by the transfer unit 13 from the photoelectric conversion unit 12 to the floating diffusion 15, and a dark signal (i.e. a noise signal) when the potential of the floating diffusion 15 is reset to the reset potential. It should be understood that the pixel structure shown in FIG. 4 is only one example; it would be possible to employ a different structure. Moreover, it would also be acceptable to arrange to dispose a portion of the plurality of transistors making up the pixel upon one of the substrates other than the first substrate 111.

Figure 5:
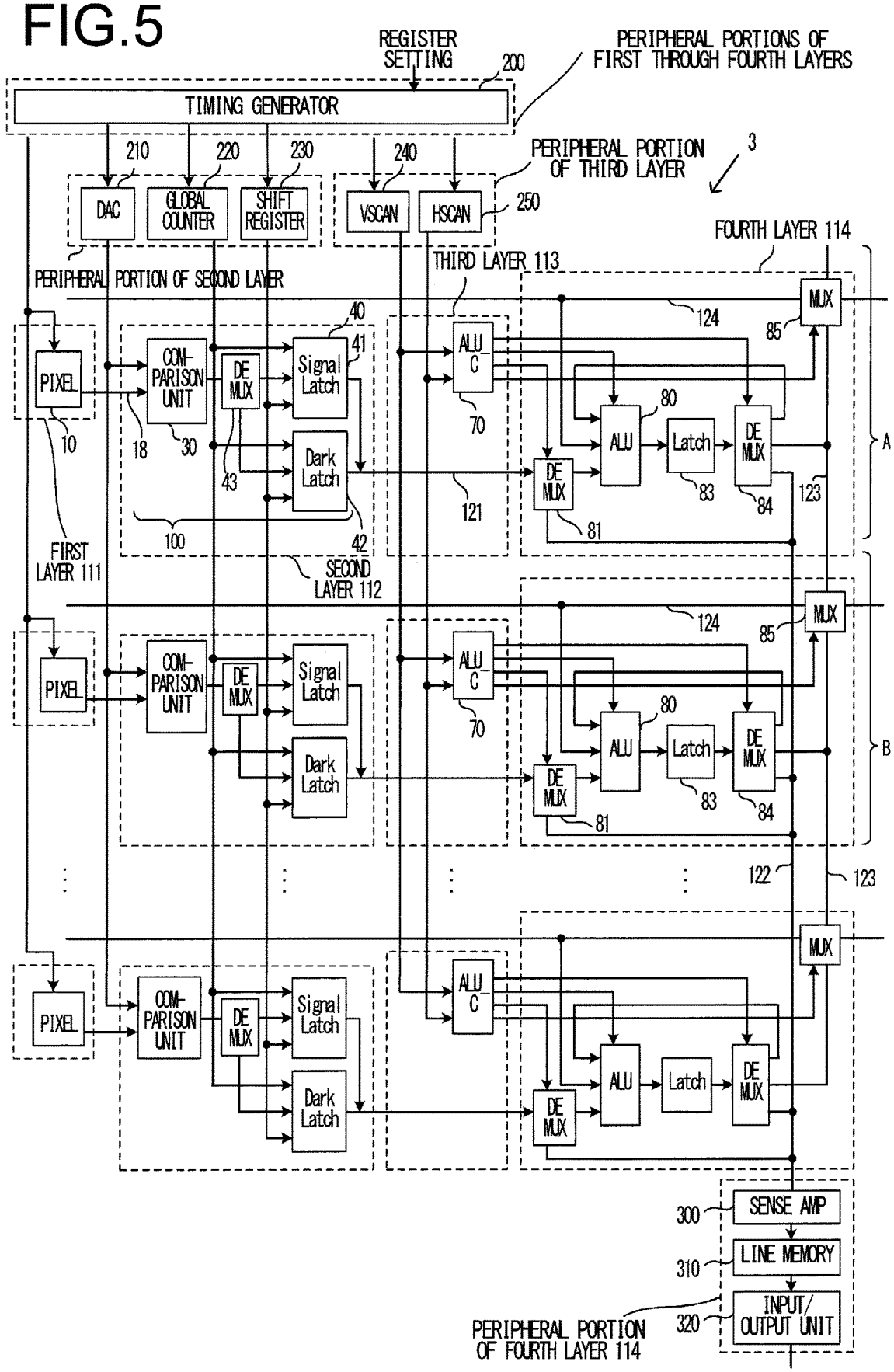
FIG. 5 is a block diagram showing the details of the structure of the image sensor according to the first embodiment.

FIG. 5 is a block diagram showing the details of the structure of the image sensor according to this first embodiment. This image sensor 3 comprises the plurality of pixels 10, a timing generator 200, a D/A conversion unit 210, a global counter 220, a shift register 230, a VSCAN circuit (i.e. a vertical scan circuit) 240, an HSCAN circuit (i.e. a horizontal scan circuit) 250, a sense amp 300, a line memory 310, and an input/output unit 320. The image sensor 3 further comprises the A/D conversion units 100, the control units 70, the calculation units 80, storage units 83, demultiplexers 81, demultiplexers 84, and multiplexers 85. The A/D conversion unit 100 comprises the comparison unit 30, the storage unit 40, and the demultiplexer 43. Moreover, The storage unit 40 comprises a signal storage unit 41 for a digital signal corresponding to a photoelectric conversion signal, and a noise storage unit 42 for a digital signal corresponding to a noise signal. The signal storage unit 41 and the noise storage unit 42 comprises a plurality of latch circuits corresponding to the number of bits in the signal to be stored. For example, each of the signal storage units 41 and each of the noise storage units 42 may comprise twelve latch circuits, so that each of the digital signals stored by the signal storage units 41 and by the noise storage units 42 becomes a 12-bit parallel signal.

The pixels 10 and a part of the timing generator 200 are provided in the first layer of the image sensor 3, in other words upon the first substrate 111. The timing generator 200 consists of a plurality of circuits, and these are separated and disposed upon the first substrate 111 through the fourth substrate 114. It should be understood that, in FIG. 5, the first substrate 111, the second substrate 112, the third substrate 113, and the fourth substrate 114 are respectively referred to as the first layer, the second layer, the third layer, and the fourth layer. Each of the circuits that makes up the timing generator 200 is arranged in the peripheral portion around the region where the pixel 10, the A/D conversion unit 100, the control unit 70, and the calculation unit 80 are disposed. The comparison unit 30, the signal storage unit 41, the noise storage unit 42, the demultiplexer 43, the D/A conversion unit 210, the global counter 220, the shift register 230, and a part of the timing generator 200 are provided in the second layer, in other words upon the second substrate 112.

The control units 70, the VSCAN circuit 240, the HSCAN circuit 250, and a part of the timing generator 200 are provided upon the third substrate 113. And the calculation units 80, the storage units 83, the demultiplexers 81, the demultiplexers 84, the multiplexers 85, the sense amp 300, the line memory 310, and the input/output unit 320 are provided upon the fourth substrate 114. Moreover, the D/A conversion unit 210, the global counter 220, the shift register 230, the VSCAN circuit 240, the HSCAN circuit 250, the sense amp 300, the line memory 310, and the input/output unit 320 are disposed in the peripheral portions of each of the substrates.

The timing generator 200 consists of a pulse generation circuit and so on and generates a pulse signal or the like on the basis of register setting values outputted from the control unit 4 of the image capture device 1, and outputs this signal to the pixels 10, the D/A conversion unit 210, the global counter 220, the shift register 230, the VSCAN circuit 240, and the HSCAN circuit 250. The register setting values may, for example, be set according to the shutter speed (i.e. the charge accumulation times of the photoelectric conversion units), the ISO speed, the presence or absence of image correction, and so on. The D/A conversion unit 210 generates, as a reference signal, a ramp signal whose signal level varies on the basis of a pulse signal from the timing generator 200. Moreover, the D/A conversion unit 210 is connected in common to each of the comparison units 30 that are provided for each of the pixels 10, and outputs the reference signal to each of the comparison units 30. The global counter 220 generates a signal that specifies a count value (for example, a clock signal) on the basis of the pulse signal from the timing generator 200, and outputs this signal to the signal storage units 41 and to the noise storage units 42. The shift register 230 generates a timing signal on the basis of the pulse signal from the timing generator 200, and outputs this signal to the signal storage units 41 and to the noise storage units 42. On the basis of the timing signals from the shift register 230, the signal storage units 41 and the noise storage units 42 convert the parallel signals that they have respectively stored into serial signals, and output the results to the calculation units 80. The signal storage units 41 and the noise storage units 42 function as signal processing units that output digital signals as serial signals.

The VSCAN circuit 240 and the HSCAN circuit 250 sequentially select the control units 70 on the basis of signals from the timing generator 200, and output to each of the control units 70 signals specifying the details of calculations (arithmetic calculations) to be performed by the calculation units 80 and the pixels 10 that are to be the subjects of calculation and so on. A signal line 123 and a signal line 124 are connected to each of the multiplexers 85 provided to each of the pixels 10. The signal lines 123 and the signal lines 124 may, for example, be arranged two dimensionally upon the fourth substrate 114 along its row direction and along its column direction. The multiplexer 85 is controlled by the control unit 70, and select the signal to be the subject of calculation by the calculation unit 80 from the signals inputted to the signal lines 123 and to the signal lines 124.

The sense amp 300 is connected to the signal line 122 to which the signals calculated by the calculation units 80 of each of the pixels 10 are inputted, and reads out the signals at high speed by amplifying and reading out the signals inputted to the signal line 122. These signals that have been read out by the sense amp 300 are stored in the line memory 310. The input/output unit 320 performs signal processing upon the signals outputted from the line memory 310 such as adjustment of the signal bit width and addition of synchronization codes and so on, and outputs the result as an image signal to the control unit 4 of the image capture device 1. This input/output unit 320 is built as, for example, an input and output circuit or the like corresponding to a high speed interface of the LVDS or SLVS type or the like, and transmits a signal at high speed.

The A/D conversion unit 100 sequentially performs A/D conversion upon each of the photoelectric conversion signals and the noise signals read out sequentially from the pixel 10. The calculation unit 80 performs calculation of signals between the pixels, after having performed CDS processing by subtraction of the digital signals due to the noise signals that have been converted by the A/D conversion units 100 from the digital signals due to the photoelectric conversion signals. The details thereof will be explained hereinafter.

When the noise signal of each of the pixels 10 is outputted to its corresponding comparison unit 30, the comparison unit 30, which includes a comparator circuit and so on, compares the noise signal outputted from the pixel 10 with the reference signal which is supplied by the D/A conversion unit 210, and outputs the result of this comparison via the demultiplexer 43 to the noise storage unit 42. And, on the basis of this result of comparison by the comparison unit 30 and the clock signal from the global counter 220, the noise storage unit 42 stores a count value which corresponds to the elapsed time from the time point of the start of comparison by the comparison unit 30 to the time point of output of the comparison result, as a digital signal corresponding to the noise signal. When the photoelectric conversion signal of each of the pixels 10 is outputted to its corresponding comparison unit 30, the comparison unit 30 compares the photoelectric conversion signal with the reference signal, and outputs the result of this comparison via the demultiplexer 43 to the signal storage unit 41. And, on the basis of the result of comparison by the comparison unit 30 and the clock signal, the signal storage unit 41 stores the count value corresponding to the elapsed time from the time point of the start of comparison by the comparison unit 30 to the time point of output of the comparison result as a digital signal corresponding to the photoelectric conversion signal. In this manner, in the present embodiment, each 12-bit digital signal is stored in the corresponding signal storage unit 41 and noise storage unit 42.

On the basis of the timing signal from the shift register 230, the noise storage unit 42 time-shifts the 12-bit digital signal stored in the noise storage unit 42 one bit at a time, and outputs the results in sequence to the signal line 121 shown in FIG. 5. This serial signal outputted to the signal line 121 is inputted to the calculation unit 80 via the demultiplexer 81. The calculation unit 80 stores a digital signal corresponding to the noise signal sequentially in the storage unit 83. In other words, a 12-bit digital signal related to the noise signal is stored in the storage unit 83.

The signal line 121 serves as a signal line that connects the storage unit 40 of the second substrate 112 and the demultiplexer 81 of the fourth substrate 114, and consists of a signal line that employs the through electrodes 118 and 119 shown in FIG. 2 and bumps and so on. Generally it is difficult to form a large number of through electrodes at a narrow pitch, so that it is difficult to transmit a large number of parallel signals from the second substrate 112 to the fourth substrate 114 simultaneously. However, in this embodiment, the parallel signal stored in the storage unit 40 of the second substrate 112 is converted into a serial signal, and is then outputted to the fourth substrate 114. Due to this, it is possible to reduce the amount of wiring connecting the second substrate 112 and the fourth substrate 114, and it is possible to output the digital signals for the various pixels 10 simultaneously. Moreover, it is possible to avoid increase of the chip area due to the formation of a large number of through electrodes and so on.

After the 12-bit digital signal due to the noise signal has been inputted to the storage unit 83, on the basis of a timing signal from the shift register 230, the signal storage unit 41 converts the digital signal corresponding to the photoelectric conversion signal stored in the storage unit 41 to a serial signal, which is then outputted via the signal line 121 and the demultiplexer 81 to the calculation unit 80. And, on the basis of a control signal from the control unit 70, the calculation unit 80 outputs (i.e. feeds back) the 12-bit digital signal corresponding to the noise signal stored in the storage unit 83 via the demultiplexer 84 to the calculation unit 80, one bit at a time.

The calculation unit 80 generates a corrected signal by performing subtraction of the digital signal corresponding to the noise signal outputted from the storage unit 83 one bit at a time from the digital signal corresponding to the photoelectric conversion signal outputted one bit at a time from the signal storage unit 41. The calculation unit 80 stores this corrected signal that is generated one bit at a time sequentially in the storage unit 83. The calculation unit 80 performs subtraction a plurality of times in accordance with the number of bits in the signal stored in the storage unit 40, and sequentially stores the correction signal which is the result of this subtraction in the storage unit 83. In this embodiment subtraction processing is performed twelve times, since each of the digital signals in the signal storage unit 41 and in the noise storage unit 42 that constitute the storage unit 40 is a 12-bit digital signal. The digital signal corresponding to the 12-bit noise signal and the 12-bit corrected signal are stored in the storage unit 83. Due to this, the storage unit 83 incorporates 24 latch circuits and so on. In this manner, in this embodiment, digital CDS in which differential processing is performed of the digital signal of the photoelectric conversion signal and the digital signal of the noise signal is performed in a time division manner, one bit at a time. Moreover, one calculation unit 80 is provided for each of the pixels 10, so that this digital CDS is performed simultaneously for all of the pixels 10.

After having performed the digital CDS, the calculation unit 80 performs calculation between the corrected signals generated for each of the pixels 10. In FIG. 5, for example, calculation is performed between the corrected signals related to two pixels 10 that are positioned in a region A and a region B which are mutually adjacent. That is, the 12-bit corrected signal for the pixel 10 in the region A stored in the storage unit 83 for the region A is inputted (i.e. fed back) to the calculation unit 80 for the region A via the demultiplexer 84, one bit at a time. In a similar manner, the 12-bit corrected signal for the pixel 10 in the region B stored in the storage unit 83 for the region B is inputted to the calculation unit 80 for the region A, one bit at a time, via the demultiplexer 84 for the region B, the multiplexer 85 for the region B, and the multiplexer 85 for the region A. Thus, the calculation unit 80 for the region A calculates the 12-bit corrected signal for the region A and the 12-bit corrected signal for the region B that are inputted one bit at a time, and generates a pixel signal. The calculation unit 80 performs calculation a plurality of times corresponding to the number of bits in the corrected signals, and stores the pixel signal that is the result sequentially in the storage unit 83. After this calculation between the corrected signals, the 12-bit corrected signal and the 12-bit pixel signal are stored in the storage unit 83.

The calculation unit 80 outputs the pixel signal stored in the storage unit 83 to the signal line 122 via the demultiplexer 84. The sense amp 300 amplifies the pixel signals outputted to the signal line 122 and reads them out. The calculation unit 80 provided for each of the pixels 10 outputs the signal sequentially to the signal line 122, and the sense amp 300 sequentially reads out the signals outputted to the signal line 122. The pixel signals that are read out by the sense amp 300 are sequentially stored in the line memory 310. And the input/output unit 320 performs signal processing upon the signals sequentially outputted from the line memory 310, and outputs the signal after signal processing as an image signal.

Figure 6:
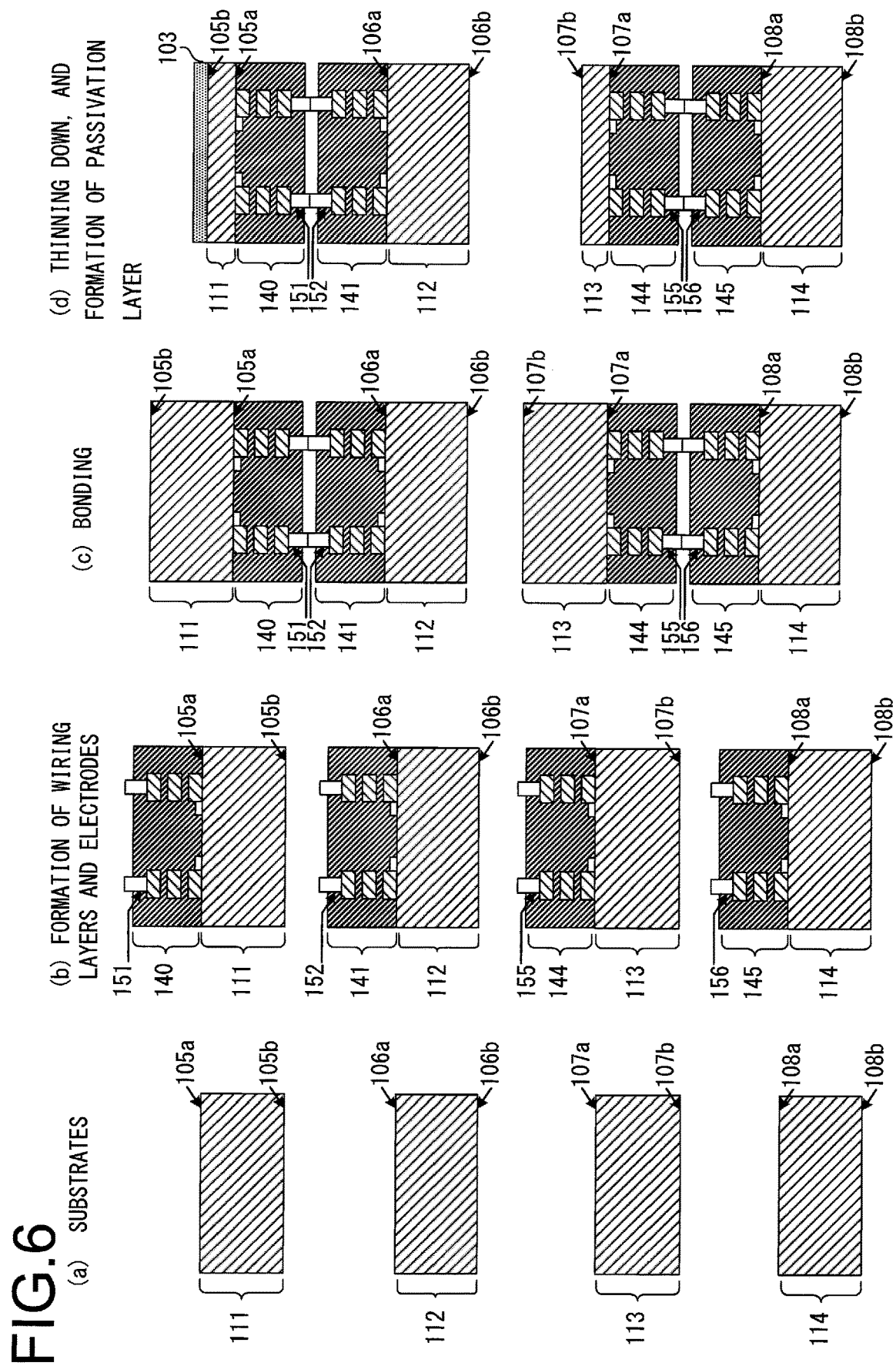
FIG. 6 is a figure showing a method of manufacturing the image sensor according to the first embodiment.
Figure 7:
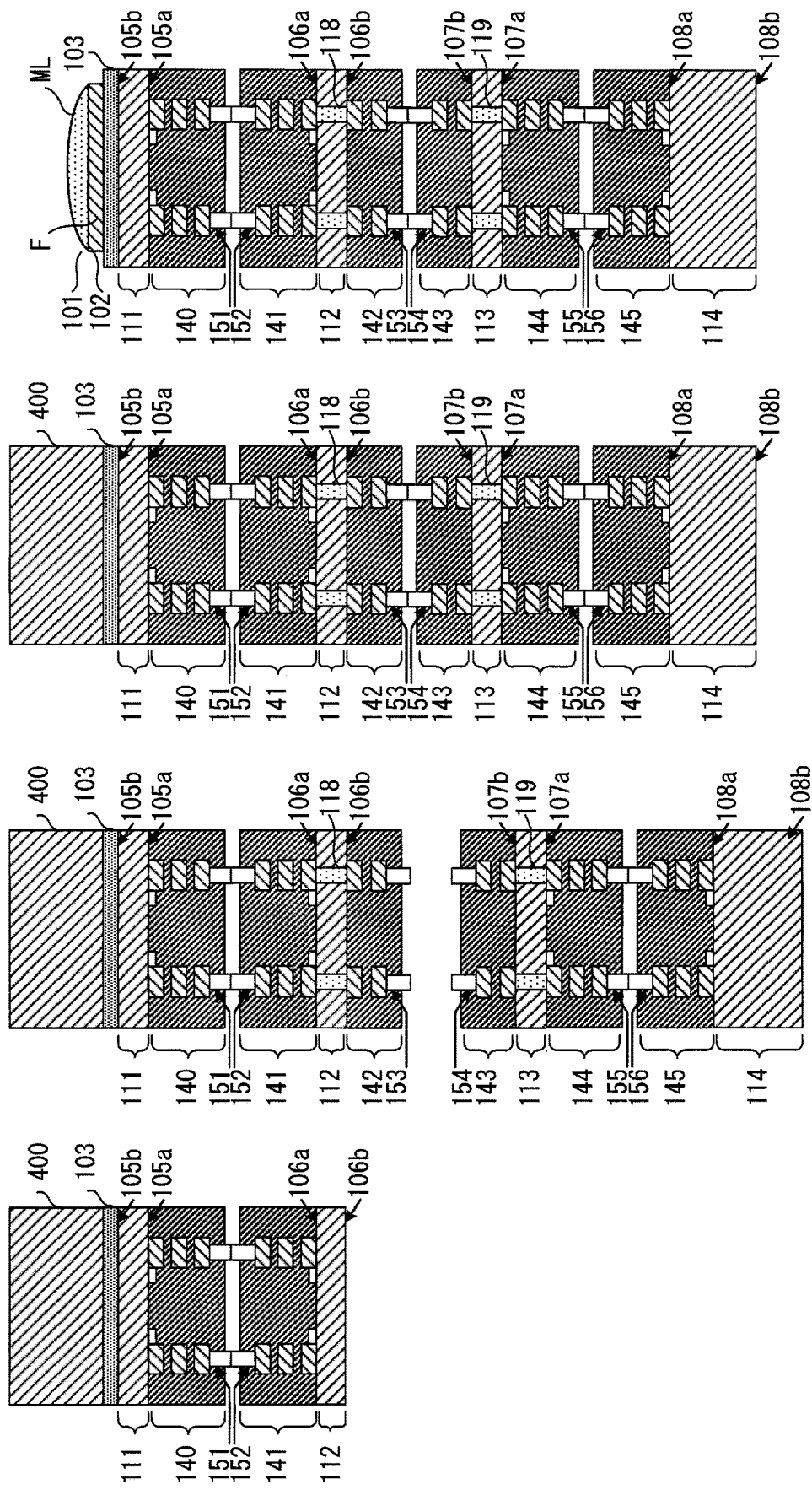
FIG. 7 is a figure showing this method of manufacturing the image sensor according to the first embodiment.

FIG. 6 and FIG. 7 are figures showing a method of manufacturing this image sensor according to the first embodiment. First, as shown in FIG. 6(*a*), the first substrate 111 through the fourth substrate 114 are prepared. The first substrate 111 through the fourth substrate 114 are semiconductor substrates for which any desired electrically conductive semiconductor substrate may be employed. And elements of various types such as transistors and so on are formed upon the first surface 105*a* of the first substrate 111, upon the first surface 106*a* of the second substrate 112, upon the first surface 107*a* of the third substrate 113, and upon the first surface 108*a* of the fourth substrate 114. Gate electrodes and gate insulation layers are formed upon the first surfaces 105*a*, 106*a*, 107*a*, and 108*a*. And, as shown in FIG. 6(*b*), wiring layers 140, 141, 144, and 145, each of which includes a conductor layer and an insulation layer, are formed upon the first surfaces 105*a*, 106*a*, 107*a*, and 108*a* respectively. For example, a plurality of wires and an insulation layer between the wires may be formed upon each of the wiring layers 140, 141, 144, and 145. After the wiring layers 140, 141, 142, and 143 have been formed, connection portions 151, 152, 155, and 156 consisting of bumps or electrodes or the like are formed. These connection portions 151, 152, 155, and 156 are formed by employing a metallic material. Since per se known semiconductor processes may be employed for forming these elements of various types and the wiring layers and electrodes and so on, explanation thereof will here be omitted.

Next, as shown in FIG. 6(*c*), the first surface 105*a* of the first substrate 111 and the first surface 106*a* of the second substrate 112 are arranged so as to face one another, and are joined together by their connection portions 151 and their connection portions 152. Similarly, the first surface 107*a* of the third substrate 113 and the first surface 108*a* of the fourth substrate 114 are arranged so as to face one another, and are joined together by their connection portions 155 and their connection portions 156. And, after the substrates have been bonded together by their connection portions, as shown in FIG. 6(*d*), parts of the first substrate 111 and the third substrate 113 are removed by etching or CMP (Chemical Mechanical Polishing), so that the thicknesses of the first substrate 111 and the third substrate 113 are reduced and they are thinned down. Moreover, a passivation layer 103 is formed upon the second surface 105*b* of the first substrate 111.

Next, as shown in FIG. 7(*a*), a support substrate 400 is adhered upon the second surface 105*b* of the first substrate 111 with the passivation layer 103 between them. And a part of the second substrate 112 is removed by etching or the like, so that the thickness of the second substrate 112 is reduced and it is thinned down. Next, as shown in FIG. 7(*b*), through electrodes 118 and 119 are formed upon the second substrate 112 and the third substrate 113 respectively. This formation of the through electrodes 118 and the through electrodes 119 may be performed by employing a per se known semiconductor process. After formation of the through electrodes 118 and 119, an inter-substrate connection layer 142 and connection portions 153 such as bumps or electrodes or the like are formed upon the second surface 106*b* of the second substrate 112, and an inter-substrate connection layer 143 and connection portions 154 such as bumps or electrodes or the like are formed upon the second surface 107*b* of the third substrate 113. It should be understood that, as far as the through electrodes 118 and the through electrodes 119 are concerned, it would also be acceptable to arrange to form them, at the stage of FIG. 6(*b*), upon the first surface 106*a* of the second substrate 112 and upon the first surface 107*a* of the third substrate 113.

Next, as shown in FIG. 7(*c*), the second surface 106*b* of the second substrate 112 and the second surface 107*b* of the third substrate 113 are arranged so as to face one another, and are joined together by their connection portions 153 and their connection portions 154. And, after bonding these two substrates together via their connection portions, the support substrate 400 is trimmed away, as shown in FIG. 7(*d*). And a color filter layer 102 and a micro-lens layer 101 are formed in series upon the second surface 105*b* of the first substrate 111, via the passivation layer 103. The image sensor 3 shown in FIG. 2 can be manufactured by a manufacturing method such as described above. It should be understood that the method of manufacture of the image sensor shown in FIG. 6 and FIG. 7 is only an example; it would also be acceptable to arrange to employ a different manufacturing method. This image sensor may be manufactured by various manufacturing methods.

According to the embodiment described above, the following beneficial operational effects are obtained.

(1) The image sensor 3 comprises: the photoelectric conversion layer 161 including the photoelectric conversion unit 12 that photoelectrically converts incident light; the first circuit layer 162 that is laminated upon the photoelectric conversion layer 161, and that includes the first circuit; the second circuit layer 163 that is laminated upon the first circuit layer 162, and that includes the second circuit; and the third circuit layer 164 that is laminated upon the second circuit layer 163, and that includes the third circuit. A surface of the photoelectric conversion layer 161 upon which electrodes (i.e. gate electrodes) are provided (i.e. its first surface 105a) and a surface of the first circuit layer 162 upon which electrodes (i.e. gate electrodes) are provided (i.e. its first surface 106a) are stacked so as to face one another, and a surface of the second circuit layer 163 upon which electrodes (i.e. gate electrodes) are provided (i.e. its first surface 107a) and a surface of the third circuit layer 164 upon which electrodes (i.e. gate electrodes) are provided (i.e. its first surface 108a) are laminated so as to face one another. Since this is done, accordingly it is possible to arrange a plurality of circuits and so on for processing the signals from the pixels 10 without increasing the chip area. Moreover, it is possible to avoid deterioration of the aperture ratio of the pixels 10. Additionally, it is possible to connect circuits provided in the photoelectric conversion layer 161 and circuits provided in the first circuit layer 162 together electrically via, for example, a plurality of bumps, so that it is possible to transmit the large number of signals created by the pixels 10 in the photoelectric conversion layer 161 simultaneously to the first circuit layer 161.

(2) The image sensor 3 comprises: the photoelectric conversion layer 161 including the semiconductor layer 111 that includes the photoelectric conversion unit 12 that photoelectrically converts incident light, and the wiring layer 140; the first circuit layer 162 that is laminated upon the wiring layer 140 side of the photoelectric conversion layer 161, and that includes the first semiconductor layer 112 and the first wiring layer 141 that is electrically connected to the wiring layer 140 of the photoelectric conversion layer 161; the second circuit layer 163 that is laminated upon the first semiconductor layer 112 side of the first circuit layer 162, and that includes the second semiconductor layer 113 and the second wiring layer 144 that is electrically connected to the first wiring layer 141; and the third circuit layer 164 that is laminated upon the second wiring layer 144 side of the second circuit layer 163, and that includes the third semiconductor layer 114 and the third wiring layer 145 that is electrically connected to the second wiring layer 144. With this structure, it is possible to arrange the plurality of circuits and so on for processing the signals from the pixels 10 without increasing the chip area. Moreover, it is possible to avoid deterioration of the aperture ratio of the pixels 10.

(3) The first circuit layer 162 includes the first connection portions 153 that are provided upon a different surface thereof from its surface upon which electrodes (i.e. the gate electrodes) are provided, and that are electrically connected to the first circuit; the second circuit layer 163 includes the second connection portions 154 that are provided upon a different surface thereof from its surface upon which electrodes (i.e. the gate electrodes) are provided, and that are electrically connected to the first connection portions 153 and to the second circuit; and the first circuit and the second circuit are connected together via the first connection portions 153 and the second connection portions 154. Due to this, it is possible for a large number of signals to be transmitted between the circuit of the first circuit layer 162 and the circuit of the second circuit layer.

(4) The construction includes the first through electrodes 118 that are provided to the first circuit layer 162 and electrically connect the first circuit and the first connection portions 153, and the second through electrodes 119 that are provided to the second circuit layer 163 and electrically connect the second circuit and the second connection portions 154. In this embodiment, the through electrodes 118 and the through electrodes 119 are connected via the connection portions 153 and the connection portions 154. Due to this, it is possible to provide the through electrodes 118 and the through electrodes 119 in mutually different positions. Moreover, it is not necessary to form long through electrodes that pass through the two substrates, and it is possible to avoid deterioration of the yield rate of the image sensor and increase of its chip area.

(5) The first circuit layer 162 includes the A/D conversion units 100 that A/D convert the signals outputted from the photoelectric conversion units 12 and that output digital signals; the third circuit layer 164 includes the calculation units (i.e. the calculation units 80) that perform calculation processing upon the digital signals; and the second circuit layer 163 includes the control units 70 that control the calculation units 80. Since this is done, accordingly it is possible to connect together the pixels 10 of the photoelectric conversion layer 161 and the A/D conversion units 100 of the first circuit layer 162 via a plurality of bumps. Due to this, it is possible to output the signals from the pixels 10 simultaneously to the A/D conversion units 100, one of which is provided for each pixel. And, due to this, it is possible for A/D conversion to be performed simultaneously by the A/D conversion units 100. Moreover, it is possible to connect together the control units 70 of the second circuit layer 163 and the calculation units 80 of the third circuit layer 164 via a plurality of bumps. Due to this, the control units 70 of the second circuit layer 163 perform control of the details of calculation and so on performed by the calculation units 80 by supplying control signals to the calculation units 80 of the third circuit layer 164 from along the Z axis direction shown in FIG. 2. As a result, it is possible to perform calculation upon the signal from any desired pixel 10 without causing any increase in the chip area of the image sensor 3. Moreover, it is possible to perform calculations between adjacent pixels, or between pixels that are disposed in different regions.

(6) The first circuit layer 162 includes the signal processing units (the signal storage units 41 and the noise storage units 42) that output digital signals as serial signals. Since this is done, accordingly it is possible to reduce the amount of wiring joining the first circuit layer 162 and the third circuit layer 164, and it is possible to output the digital signals for each of the pixels 10 simultaneously. Moreover, it is possible to avoid increase of the chip area due to the formation of a large number of through electrodes and so on.

The Second Embodiment

Figure 8:
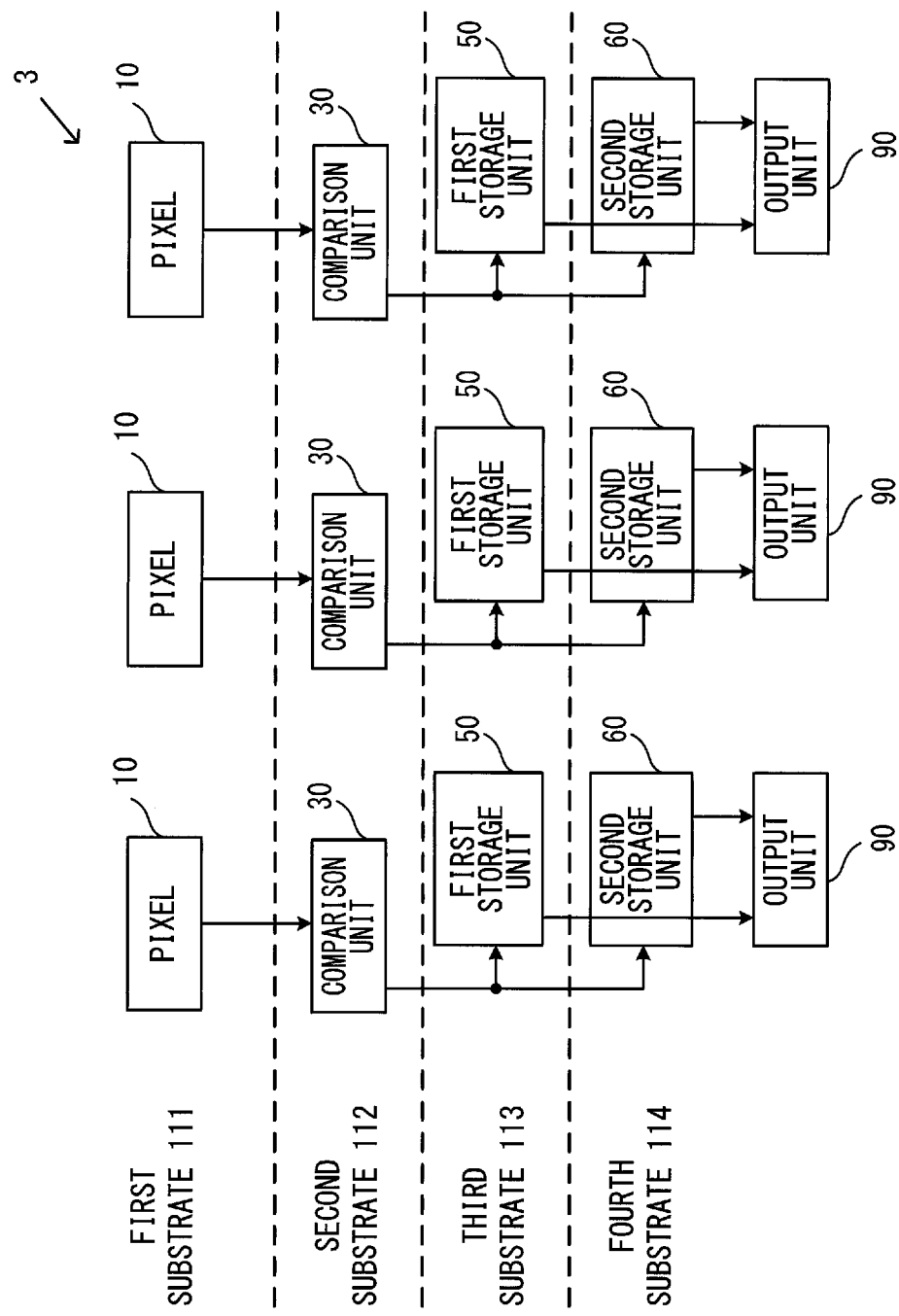
FIG. 8 is a block diagram showing the structure of an image sensor according to a second embodiment.

An image sensor according to a second embodiment of the present invention will now be explained with reference to FIG. 8 and FIG. 9. It should be understood that, in the figures, portions that are equivalent to portions of the first embodiment are denoted by the same reference symbols, and that this explanation will principally concentrate upon the features of difference from the image sensor of the first embodiment. FIG. 8 is a block diagram showing the structure of this capture element according to the second embodiment. A first substrate 111 includes a plurality of pixels 10 arranged in a two dimensional array, and a second substrate 112 includes a plurality of comparison units 30. The comparison units 30 compare the signals outputted from the pixels with reference signals, and output the results of these comparisons to a third substrate 113 and to a fourth substrate 114.

The third substrate 113 includes a plurality of first storage units 50. And the fourth substrate 114 includes a plurality of second storage units 60 and output units 90. The first storage unit 50 and the second storage unit 60 are provided for each pixel 10, and they comprise latch circuits and so on. The A/D conversion units 100 includes a comparison unit 30, a first storage unit 50, and a second storage unit 60, and converts the signal outputted from its pixel 10 into a digital signal having a predetermined number of bits. The first storage unit 50 stores digital signals consisting of the lower ranking bits in these digital signals of the predetermined number of bits, and the second storage unit 60 stores digital signals consisting of the higher ranking bits in these digital signals of the predetermined number of bits. Clock signal that specifies count value is supplied from a global counter 220 shown in FIG. 9 to the first storage unit 50 and to the second storage unit 60. Here, the "lower ranking bits" means the bits of the digital signal that is generated by a signal of relatively high frequency among the clock signals outputted from the global counter 220. Moreover, the "higher ranking bits" means the bits of the digital signal that is generated by a signal of relatively low frequency among the clock signals outputted from the global counter 220. In other words, the frequency of the clock signal that is inputted to the first storage units 50 is higher than the frequency of the clock signal that is inputted to the second storage units 60.

Figure 9:
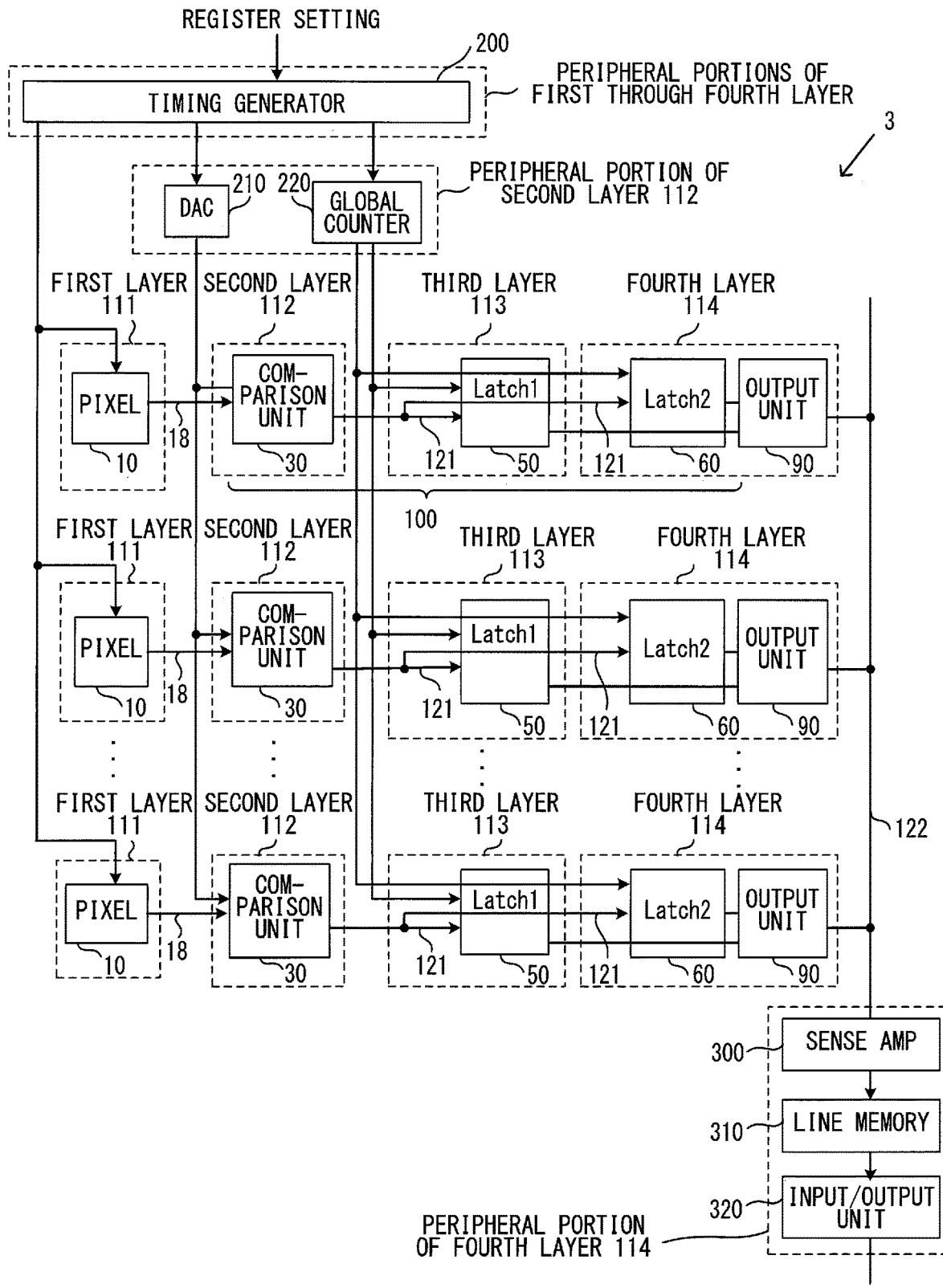
FIG. 9 is a block diagram showing the details of the structure of this image sensor according to the second embodiment.

FIG. 9 is a block diagram showing the detailed structure of this image sensor according to the second embodiment. The pixels 10 and a part of a timing generator 200 are provided on the first substrate 111. The comparison units 30, the D/A conversion unit 210, the global counter 220, and a part of the timing generator 200 are provided upon the second substrate 112. The first storage unit 50 and a part of the timing generator 200 are provided upon the third substrate 113. And the second storage unit 60, the output unit 90, a part of the timing generator 200, the sense amp 300, the line memory 310, and the input/output unit 320 are provided upon the fourth substrate 114. It should be understood that, in FIG. 9, the first substrate 111, the second substrate 112, the third substrate 113, and the fourth substrate 114 are respectively referred to as the first layer, the second layer, the third layer, and the fourth layer.

The global counter 220 performs measurement by employing a signal from the timing generator 200 and generates a plurality of signals (for example, clock signals) of different frequencies that indicate count values, and outputs these signals to the first storage unit 50 and to the second storage unit 60. And, on the basis of the signals outputted from the comparison unit 30, the first storage unit 50 and the second storage unit 60 store, as digital signals, count values corresponding to the time periods until the magnitude relationships of the levels of the signals outputted from the pixels 10 and the level of a ramp signal (i.e. of a reference signal) change (i.e. invert). The count value that results from these measurements by the first storage unit 50 and the second storage unit 60 is stored as digital signal. In other words, the first storage unit 50 and the second storage unit 60 store digital signal on the basis of the results measured with clock signals of a plurality of different frequencies.

The first storage unit 50 stores digital signal based upon the results of measurement, with a clock signal of a first frequency, of the time periods until the magnitude relationships of the signals outputted from the pixels 10 and the reference signal change, when the signals outputted from the pixels 10 and the reference signal outputted from the D/A conversion unit 210 are compared. And the second storage unit 50 stores digital signal based upon the results of measurement, with a clock signal of a second frequency which is lower than that of the clock signal of the first frequency, of the time periods until the magnitude relationships of the signals outputted from the pixels 10 and the reference signal change, when the signals outputted from the pixels 10 and the reference signal outputted from the D/A conversion unit 210 are compared. The digital signals stored by the first storage units 50 and by the second storage units 60 are outputted to the output unit 90.

The signal line 121 to which the output signal of the comparison unit 30 is transmitted is a signal line that connects the comparison unit 30 on the second substrate 112 to the first storage unit 50 on the third substrate 50 and to the second storage unit 60 on the fourth substrate 114, and that employs the through electrodes 118 and 119 shown in FIG. 2 and/or bumps or the like. With the fourth substrate 114 which is at the position distant from the comparison unit 30 which is on the second substrate 112, delay or dulling of the comparator output signal due to parasitic capacitance of the wiring and/or junction capacitance between the layers, and/or variation between the pixels, may occur. Due to this, sometimes deviation in the latch timing at which the latching operation is performed may occur. In this embodiment, among the first storage units 50 and the second storage units 60, the first storage unit 50 which stores the lower ranking bits of the digital signals is disposed at position that is closer to the comparison unit 30 than are the second storage unit 60. In other words, the first storage unit 50 is provided between the comparison unit 30 and the second storage unit 60. In FIG. 8 and FIG. 9, the third substrate 113 which includes the first storage unit 50 is provided between the second substrate 112 which includes the comparison unit 30 and the fourth substrate 114 which includes the second storage unit 60.

Sometimes it may happen that the input timing of the output signal from an comparison unit 30 to a second storage unit 60 is delayed. However, since the frequency of the clock signal that specifies the count value inputted to the second storage units 60 is low, in other words the change of the count value that yields the higher ranking bits is slow, accordingly it is possible to reduce the influence of deviation of the latch timing, and thus to reduce the conversion error of the A/D conversion. In this manner, by providing the first storage unit 50 which stores the digital signal based upon the clock signal having the first frequency which is higher than the second frequency at position that is closer to the comparison unit 30 than the second storage unit 60, it is possible to reduce the influence due to delay of the signal from the comparison unit 30. Because of this, it is possible to implement A/D conversion at high accuracy.

The digital signals stored in the first storage unit 50 and the second storage unit 60 are outputted to the signal line 122 by the output unit 90 that is provided for each of the pixels 10. Each of the output units 90 that is provided for each of the pixels 10 output the signal sequentially to the signal line 122, and the sense amp 300 sequentially reads out the signal that has been outputted to the signal line 122. The signal that is read out by the sense amp 300 is stored sequentially in the line memory 310. And the input/output unit 320 performs signal processing upon the signals outputted sequentially from the line memory 310, and outputs the resulting signal after signal processing as an image signal.

It should be understood that while, in this embodiment, the first storage unit 50 for the lower ranking bits is provided upon the third layer 113 and the second storage unit 60 for the higher ranking bits is provided upon the fourth layer 114, the opposite arrangement would also be acceptable, in other words a version with the first storage unit 50 for the lower ranking bits being provided upon the fourth layer 114 and with the second storage unit 60 for the higher ranking bits being provided upon the third layer 113. By providing the first storage unit 50 and the second storage unit 60 upon different substrates in this manner, it is possible to arrange the plurality of storage units without causing any increase of the chip area, so that it is possible to enhance the number of bits (i.e. the resolving power) of the A/D conversion process. In addition, both the first storage unit 50 and also the second storage unit 60 are provided as stacked near to the corresponding pixels 10. Due to this, it is possible to avoid deterioration of the aperture ratio of the pixels 10.

According to the above-described embodiment, in addition to beneficial operational effects similar to those of the first embodiment, the following beneficial operational effects can be obtained.

(7) The first circuit layer 162 includes the comparison unit 30 that compares the signal outputted from the photoelectric conversion unit 12 with reference signal; the second circuit layer 163 includes the first storage unit 50 that, based upon the results of comparison by the comparison unit 30, stores digital signal having a first number of bits among the digital signal having a predetermined number of bits; the third circuit layer includes the second storage unit 60 that, based upon the results of comparison by the comparison unit 30, stores digital signal having a second number of bits among the digital signal having the predetermined number of bits; and the comparison unit 30, the first storage unit 50, and the second storage unit 60 constitute A/D conversion unit 100 that converts the signal read out from the photoelectric conversion unit 12 into digital signal having the predetermined number of bits. In this embodiment, the first storage unit 50 is disposed in the second circuit layer 163, and the second storage unit 60 is disposed in the third circuit layer 164. Due to this it is possible to arrange the plurality of storage units without increasing the chip area, so that it is possible to enhance the resolving power of the A/D conversion. Moreover, the first storage unit 50 and the second storage unit 60 are provided as stacked near the respectively corresponding pixels 10. Due to this, it is possible to avoid deterioration of the aperture ratio of the pixels 10.

(8) The first storage unit 50 stores the digital signal of the first bit number on the basis of the clock signal of the first frequency, and the second storage unit 60 stores the digital signal of the second bit number on the basis of the clock signal of the second frequency which is lower than the first frequency. In this embodiment, among the first storage unit 50 and the second storage unit 60, the first storage unit 50 which stores the digital signal of the lower ranking bits is disposed in positions closer to the comparison unit 30. Due to this, it is possible to reduce influence due to delay of the signal from the comparison unit 30, so that it is possible to implement A/D conversion at high accuracy.

The Third Embodiment

Figure 10:
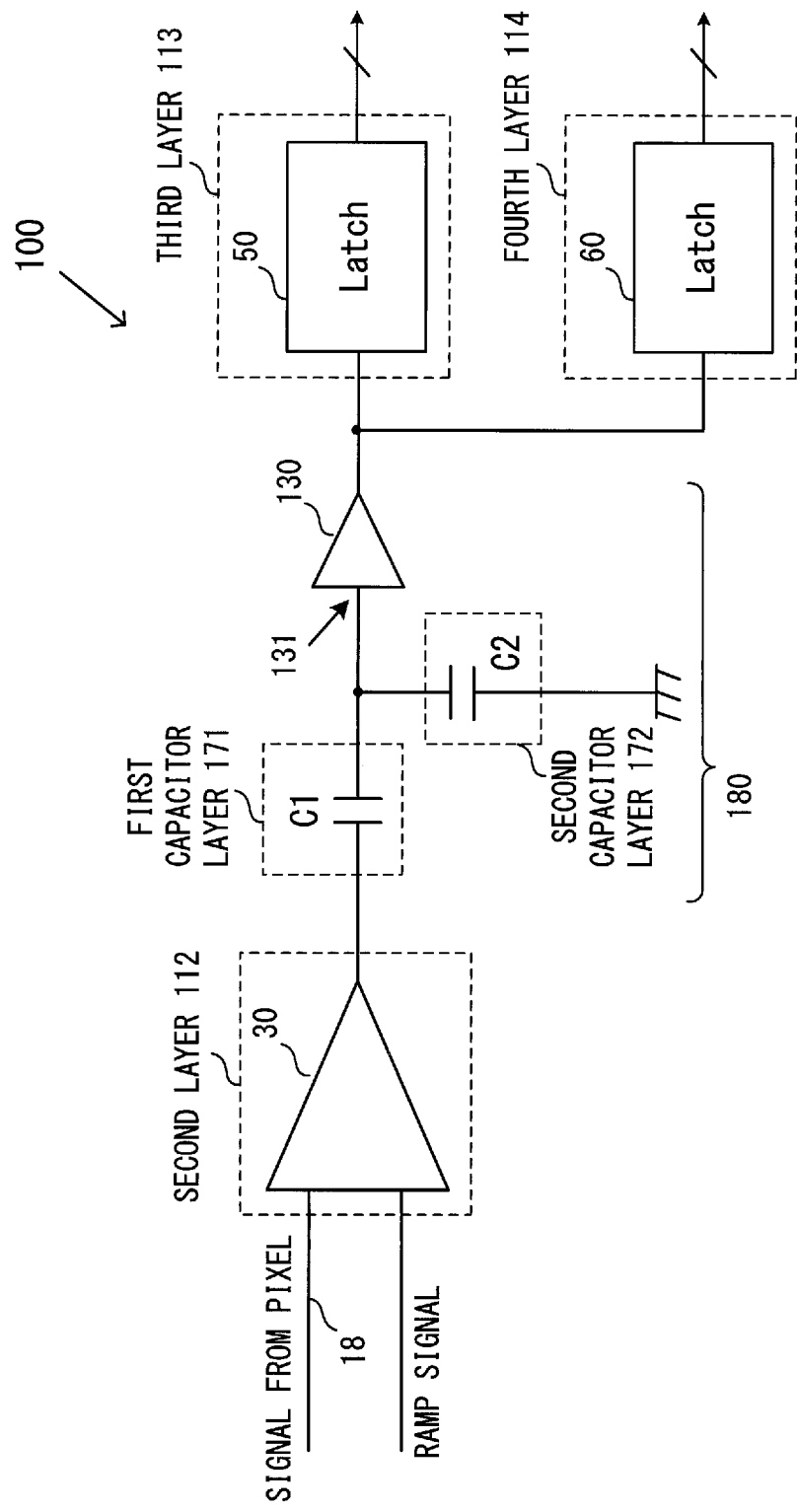
FIG. 10 is a block diagram showing the structure of an A/D conversion unit of an image sensor according to a third embodiment.

An image sensor according to a third embodiment of the present invention will now be explained with reference to FIG. 10 and FIG. 11. It should be understood that, in the figures, portions that are equivalent to portions of the first and second embodiments are denoted by the same reference symbols, and that this explanation will principally concentrate upon the features of difference from the image sensors of the first and second embodiments. FIG. 10 is a block diagram showing the structure of an A/D conversion unit 100 included in this capture element according to the third embodiment. This A/D conversion unit 100 comprises a comparison unit 300, a first storage unit 50, a second storage unit 60, and a level conversion unit 180 (i.e. a level shifter).

The level conversion unit 180 comprises a first capacitor C1, a second capacitor C2, and a buffer 130 (i.e. an amplification unit). The level conversion unit 180 converts the voltage level of the output signal of the comparison unit 30 from the level of the analog power supply employed by the comparison unit 30 and so on to the level of the digital power supply employed by the buffer 130, the first storage unit 50, the second storage unit 60, and so on. The first capacitor C1 and the second capacitor C2 are connected in series. A signal corresponding to the voltage level of the output signal of the comparison unit 30 and to the magnitude ratio of the first capacitor C1 and the second capacitor C2 is inputted to the input terminal 131 of the buffer 130. The buffer 130 converts the level of the signal that is inputted to the level of the digital power supply, and outputs this to the first storage unit 50 and to the second storage unit 60. The first capacitor C1 is provided in a first capacitor layer 171 shown in FIG. 11, and the second capacitor C2 is provided in a second capacitor layer 172 shown in FIG. 11. It should be understood that it would be acceptable for the buffer 130 to be provided upon the third substrate 113, or for it to be provided upon the fourth substrate 114. Moreover, the buffer 130 may also be provided upon some substrate that is different from both the third substrate 113 and the fourth substrate 114.

Figure 11:
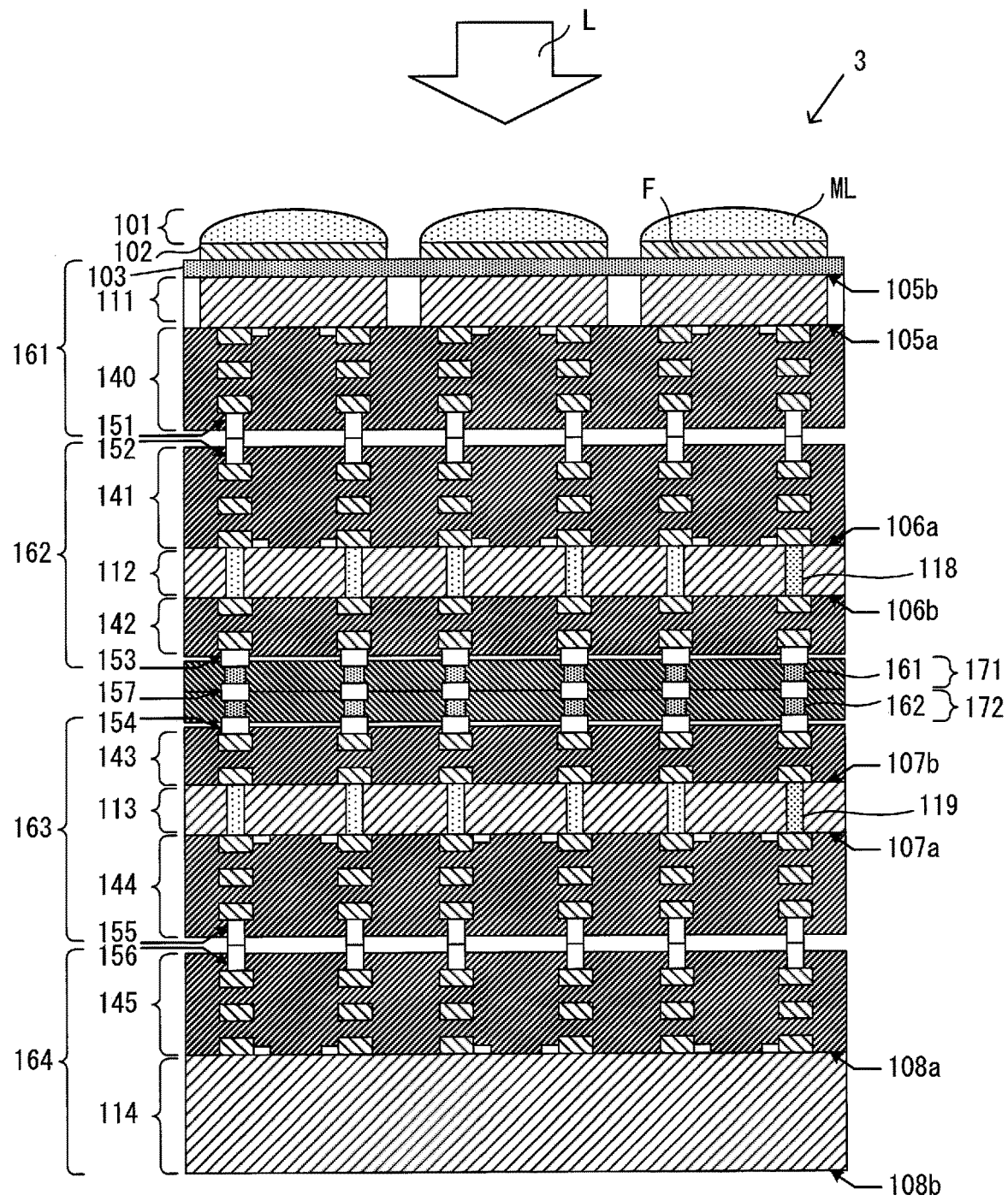
FIG. 11 is a figure showing the cross sectional structure of this image sensor according to the third embodiment.

FIG. 11 is a figure showing the cross sectional structure of the image sensor according to the third embodiment. This image sensor according to the third embodiment comprises the first capacitor layer 171 and second capacitor layer 172. The first capacitor layer 171 and the second capacitor layer 172 have insulation portions 161 and 162, respectively. The insulation portions 161 and 162 are made from an insulating material, and for example are insulating films or the like. The insulation portion 161 is connected between the connection portions 153 and the connection portions 157 of the bumps or electrodes or the like, and the insulation portion 162 is connected between the connection portions 154 and the connection portions 157. Each of the connection portions 153, 154, and 157 is made from a metallic material. The insulation portion 161, the connection portion 153, and the connection portion 157 constitute the first capacitor C1, and the insulating portion 162, the connection portion 154, and the connection portion 157 constitute the second capacitor C2.

In this embodiment, the elements of the comparison units 30 that are provided upon the second substrate 112 are connected, via the first capacitor layer 171 and the second capacitor layer 172, to elements provided upon each of the third substrate 113 and the fourth substrate 114. The first capacitor C1 and the second capacitor C2 are disposed in the first capacitor layer 171 and in the second capacitor layer 172 for converting from the level of the analog power supply to the level of the digital power supply. Due to this, it becomes unnecessary to dispose the first capacitor C1 and the second capacitor C2 upon the second substrate 112 or the third substrate 113, and accordingly it is possible to reduce the area of the circuitry to be disposed upon the second substrate 112 and upon the third substrate 113.

According to the embodiment described above, in addition to the beneficial operational effects obtained with the first and second embodiments, the following additional beneficial operational effect is also obtained.

(9) There are included the first capacitor layer 171 that is provided on the second circuit layer 163 side of the first circuit layer 162 and that includes the first capacitor C1 that is connected to the first connection portion 153, and the second capacitor layer 172 that is provided on the first circuit layer 162 side of the second circuit layer 163 and that includes the second capacitor C2 that, along with being connected to the second connection portion 154, also is connected in series with the first capacitor C1. Since these arrangements are provided, accordingly it is possible to reduce the area of circuitry to be disposed upon the second substrate 112 and the third substrate 113 and so on.

The following modifications also come within the range of the present invention, and one or a plurality of the following variant embodiments could also be combined with the embodiment described above.

The First Variant Embodiment

In the first embodiment described above, an example was explained in which the pixel signals resulting from calculations between the pixels were outputted sequentially via the signal line 122 to the sense amp 300. However, it would also be acceptable to arrange for the corrected signals stored in the storage units 83 to be outputted as pixel signals via the signal line 122 to the sense amp 300. Moreover, it would also be acceptable to arrange for both the digital signals corresponding to the photoelectric conversion signal stored in the signal storage unit 41 and also the digital signal corresponding to the noise signal stored in the noise storage unit 42 to be outputted via the demultiplexers 81 to the signal line 122.

The Second Variant Embodiment

In the first embodiment described above, an example was explained in which the CDS processing and the calculation between the pixels were performed in a time division manner, one bit at a time. However it would also be acceptable, with proper control of the calculation unit 80 and so on by the control unit 70, to arrange for the calculation to be performed several bits at a time. For example, it could be arranged for the calculation to be performed two bits at a time, or for the calculation to be performed any number of bits at a time which is smaller than the number of bits of the digital signal stored by the noise storage unit 42.

The Third Variant Embodiment

In the first embodiment described above, an example was explained in which the digital CDS was performed before performing calculation between the signals of the pixels 10. However, it would also be acceptable to arrange for analog CDS to be performed before calculation between the signals of the pixels 10. For example, differential processing of the photoelectric conversion signal and the noise signal may be performed by the A/D conversion unit 100, and, on the basis of the differentials between those signals, the analog signal may be converted into digital signal. In this case, digital signal is stored in the storage unit in which the noise signal components of each of the pixels 10 have been eliminated.

The Fourth Variant Embodiment

In the first embodiment described above, an example was explained in which the first substrate 111 includes the plurality of pixels 10, the second substrate 112 includes the plurality of A/D conversion units 100, the third substrate 113 includes the plurality of control units 70, the fourth substrate 114 includes the plurality of calculation units 80, and these four substrates were laminated together. However, the number of substrates is not to be considered as being limited to four. It would also be acceptable to arrange for the image sensor 3 to comprise three substrates that are laminated together. Moreover, in the first embodiment described above, an example was explained in which the first surface 105*a* of the photoelectric conversion layer 161 and the first surface 106*a* of the first circuit layer 162 were stacked so as to oppose one another, and the first surface 107*a* of the second circuit layer 163 and the first surface 108*a* of the third circuit layer 164 were stacked so as to oppose one another. However, it would also be acceptable to arrange for the second surface 105*b* of the photoelectric conversion layer 161 and the second surface 106*b* of the first circuit layer 162 to be stacked so as to oppose one another, and for the second surface 107*b* of the second circuit layer 163 and the first surface 108*a* of the third circuit layer 164 to be stacked so as to oppose one another. In the image sensor 3, for example, the wiring layer 140, the first substrate 111, the second substrate 112, the wiring layer 141, the wiring layer 144, the third substrate 113, the wiring layer 145, and the fourth substrate 114 are provided in that order from the side upon which the incident light L is incident. In this case, it would also be acceptable to build the image sensor 3 by laminating three substrates together (i.e. the first substrate 111 through the third substrate 113). It would also be acceptable to provide an inter-substrate connection layer between the first substrate 111 and the second substrate 112.

In the second embodiment described above, an example was explained in which the first substrate 111 includes the plurality of pixels 10, the second substrate 112 includes the plurality of comparison units 30, the third substrate 113 includes the plurality of first storage units 50, and the fourth substrate 114 includes the plurality of second storage units 60, and these four substrates were laminated together. However, the number of substrates is not to be considered as being limited to four. Moreover, the pixel 10 and the comparison unit 30 may be provided upon the same substrate. Furthermore, it would also be acceptable for the comparison unit 30 and the first storage unit 50 to be provided upon the same substrate. Even further, the first storage unit 50 and the second storage unit 60 may be provided upon the same substrate. In this case, the first storage unit 50 should be provided in position closer to the comparison unit 30 than the second storage unit 60. Additionally it would also be acceptable to provide another circuit layer between the photoelectric conversion layer 161 and the first circuit layer 162, electrically connected to both of those layers.

Furthermore, it would also be acceptable for there to be three or more substrates in which storage units (i.e. latch circuits and so on) are included, including the third substrate 113 and the fourth substrate 114. For example, the twelve storage units (i.e. latch circuits) for storing the 12-bit digital signal may be provided four together on three substrates, or may be provided individually on twelve substrates.

In the second embodiment described above, an example was explained in which the first storage unit 50 corresponding to the lower ranking bits and the second storage unit 60 corresponding to the higher ranking bits are provided. However, it would also be acceptable to provide third storage unit that stores the bits of the digital signal that are relatively central between the higher ranking bits and the lower ranking bits. In this case, on the basis of the signal outputted from the comparison unit 30, the time period until the magnitude relationships of the signals outputted from the pixels 10 change should be measured with a clock signal whose frequency is lower than that of the clock signal of the second frequency. The third storage unit stores third signal on the basis of the results measured with the clock signal of the third frequency. The digital signal based upon the clock signal of the first frequency is the digital signal for the lower ranking bits, the digital signal based upon the clock signal of the second frequency is the digital signal for the intermediate ranking bits, and the clock signal based upon the clock signals of the third frequency is the digital signal for the higher ranking bits.

It would also be acceptable to arrange for the first storage unit, the second storage unit, and the third storage unit to be disposed upon substrates that are mutually different. It would be possible to provide the substrate that includes the second storage unit 60 between the substrate that includes the first storage unit 50 and the substrate that includes the third storage unit, so that the second storage unit 60 lie between the first storage unit 50 and the third storage unit. Also, the first storage unit 50 and the second storage unit 60 could be provided upon the same substrate, with only the third storage unit being provided upon a different substrate. The first storage unit 50 should be provided at position closer to the comparison unit 30 than the second storage unit 60. Moreover, it would also be acceptable to arrange to provide the substrate that includes the first storage unit 50 and the second storage unit 60 between the substrate that includes the comparison unit 30 and the substrate that includes the third storage unit. It would also be possible to provide the second storage unit 60 and the third storage unit upon the same substrate.

The Fifth Variant Embodiment

In the embodiments described above, examples have been explained in which A/D conversion to 12-bit digital signal is performed. However, it would also be possible to apply the present invention in a similar manner in the case of A/D conversion to signal of any desired number of bits. It would also be acceptable to provide a plurality of latch circuits (i.e. of storage units) corresponding to any desired number of bits.

The Sixth Variant Embodiment

In the embodiments described above, examples have been explained in which the image sensor 3 is of the backside-illuminated type. However, it would also be acceptable for the image sensor 3 to be constructed to be of the front-illuminated type, in which a wiring layer 140 is provided upon its side upon which light is incident.

The Seventh Variant Embodiment

In the embodiments described above, examples have been explained in which photodiode is employed as the photoelectric conversion units 12. However, it would also be acceptable to arrange to employ a photoelectric conversion film for the photoelectric conversion unit 12.

The Eighth Variant Embodiment

In the embodiments described above, examples have been explained in which the A/D conversion unit 100 is provided for each of the pixels 10. However, it would also be acceptable to arrange to provide the A/D conversion unit 100 for a plurality of the pixels 10. For example, if the pixels are arranged according to a RGGB four-color Bayer array, then one A/D conversion unit 100 may be provided to correspond to each pixel block consisting of four RGGB pixels; and it would also be acceptable to arrange to provide one A/D conversion unit 100 for each pixel block consisting of any even number of and the same number of pixels in the row and the column direction.

The Ninth Variant Embodiment

In the embodiments and variant embodiments described above, examples have been explained in which A/D conversion circuit of the integrating type is employed as the A/D conversion units 100, which perform A/D conversion by varying the signal level of a reference signal as time elapses. However, it would also be acceptable to arrange to employ some other circuit structure, such as the repeated comparison type or the like. For example, an A/D conversion unit of the repeated comparison type comprises a comparison unit, a storage unit, and a capacitor unit. The capacitor unit is provided with a plurality of capacitors according to the required A/D conversion resolving power, i.e. corresponding to the number of bits in the output digital signal, and a plurality of switches that change over the states of connection of the capacitors. And the capacitor unit generates a reference signal that is determined by the signal (i.e. the voltage signal) that is inputted and by the connection state of each of the capacitors.

The comparison unit compares the signal (i.e. the photoelectric conversion signal and the noise signal) inputted from the subject pixel 10 with the reference signal inputted from the capacitor unit, and outputs the result of this comparison as an output signal. And, on the basis of this output signal, the storage unit stores a digital signal corresponding to the signal outputted from the pixel 10 in the storage unit. With this A/D conversion unit of the sequential comparison type, by changing over the states of connection of the capacitors of the capacitor unit on the basis of the result of comparison by the comparison unit, the reference signal generated by the capacitor unit is caused to change sequentially so as to perform binary searching multiple times, and accordingly a digital signal is generated corresponding to the signal outputted from the pixel 10.

When A/D conversion unit of the sequential comparison type is provided to the image sensor, then the plurality of capacitors of the capacitor unit may be disposed as divided over a plurality of substrates. For example, if the capacitor unit includes a third capacitor and a fourth capacitor whose capacitance value is greater than that of the third capacitor, then the comparison unit may be disposed in the first circuit layer 162, the third capacitor may be disposed in the second circuit layer 163, and the fourth capacitor may be disposed in the third circuit layer 164. The third capacitor is the capacitor for determining the lower ranking bits of the digital signal. Due to the above, it is possible to enhance the number of bits (i.e. the resolving power) of the A/D conversion processing, without any increase of the chip area. Moreover, since a capacitor having a small capacitance value experiences a great influence from parasitic capacitance, accordingly such a capacitor is disposed in a position closer to the comparison unit than a capacitor that has a large capacitance value. Due to this, it is possible to reduce the influence of parasitic capacitance upon the capacitors that have small capacitance values. As a result, it is possible to implement A/D conversion at high accuracy.

The Tenth Variant Embodiment

An image sensor 3 as explained in any of the embodiments described above could also be applied to a camera, to a smartphone, to a tablet, to a PC equipped with an internal camera, to an onboard camera, or the like.

In the above description various embodiments and variant embodiments have been explained, but the present invention is not to be considered as being limited by the details thereof. Other versions that are considered to come within the range of the technical concept of the present invention are also to be understood as being included within its scope.

The content of the disclosure of the following application, upon which priority is claimed, is hereby incorporated herein by reference.

Japanese Patent Application 70,960 of 2016 (filed on 31 Mar. 2016).

REFERENCE SIGNS LIST

3: image sensor
12: photoelectric conversion unit
10: pixel
30: comparison unit
70: control unit
80: calculation unit
100: A/D conversion unit

The invention claimed is:

1. An image sensor, comprising:
a first circuit layer including a first semiconductor substrate provided with a photoelectric conversion unit that photoelectrically converts light and generates a charge, and a first wiring layer provided with a wiring that transmits a signal based upon the charge generated by the photoelectric conversion unit;
a second circuit layer including a second wiring layer provided with a wiring that is connected to the wiring of the first wiring layer and transmits the signal transmitted from the wiring of the first wiring layer, and a second semiconductor substrate provided with a circuit that is connected to the wiring of the second wiring layer and processes the signal transmitted from the wiring of the second wiring layer and a through electrode that transmits the signal processed by the circuit;
a third circuit layer including a third semiconductor substrate provided with a through electrode connected to the through electrode of the second circuit layer, and a third wiring layer provided with a wiring connected to the through electrode of the third semiconductor substrate;
a fourth circuit layer including a fourth wiring layer provided with a wiring connected to the wiring of the third wiring layer, and a fourth semiconductor substrate connected to the wiring of the fourth wiring layer;
a plurality of first connection portions provided between the first circuit layer and the second circuit layer;
a plurality of second connection portions provided between the second circuit layer and the third circuit layer; and
a plurality of third connection portions provided between the third circuit layer and the fourth circuit layer, wherein:
the first circuit layer, the second circuit layer, the third circuit layer, and the fourth circuit layer are provided in that order from a side upon which the light is incident; and
the number of the first connection portions is greater than the number of the second connection portions.

2. The image sensor according to claim 1, wherein the first semiconductor substrate, the first wiring layer, the second wiring layer, the second semiconductor substrate, the third semiconductor substrate, the third wiring layer, the fourth wiring layer, and the fourth semiconductor substrate are provided in that order from the side upon which the light is incident.

3. The image sensor according to claim 1, wherein:
the wiring of the first wiring layer and the wiring of the second wiring layer are connected together via the first connection portions;
the through electrode of the second semiconductor substrate and the through electrode of the third semiconductor substrate are connected together via the second connection portions; and
the wiring of the third wiring layer and the wiring of the fourth wiring layer are connected together via the third connection portions.

4. The image sensor according to claim 1, wherein:
a plurality of wires of the first wiring layer and a plurality of wires of the second wiring layer are respectively connected together via the plurality of first connection portions;
a plurality of through electrodes of the second semiconductor substrate and a plurality of through electrodes of the third semiconductor substrate are respectively connected together via the plurality of second connection portions; and
a plurality of wires of the third wiring layer and a plurality of wires of the fourth wiring layer are respectively connected together via the plurality of third connection portions.

5. The image sensor according to claim 1, wherein the number of at least one of the first connection portions and the third connection portions is greater than the number of the through electrodes of the second semiconductor substrate, or than the number of the through electrodes of the third semiconductor substrate.

6. The image sensor according to claim 1, wherein in a plane that intersects a direction of light incidence, an area of the second connection portion is greater than an area of the through electrode of the second semiconductor substrate, or than an area of the through electrode of the third semiconductor substrate.

7. The image sensor according to claim 1, further comprising
a first capacitor layer having a first capacitor and a second capacitor layer having a second capacitor, provided between the second circuit layer and the third circuit layer, and connected to the second connection portion.

8. The image sensor according to claim 7, wherein the first capacitor and the second capacitor are connected in series.

9. The image sensor according to claim 1, wherein the first connection portion, the second connection portion, and the third connection portion are bumps or electrodes.

10. The image sensor according to claim 1, wherein:
the circuit of the second circuit layer comprises an A/D conversion unit that performs A/D conversion on a signal based upon the charge generated by the photoelectric conversion unit and outputs a digital signal;
the fourth circuit layer comprises a calculation unit that performs calculation processing upon the digital signal; and
the third circuit layer comprises a control unit that controls the calculation unit.

11. The image sensor according to claim 10, wherein the circuit of the second circuit layer comprises a signal processing unit that outputs the digital signal as a serial signal.

12. The image sensor according to claim 1, wherein:
the first circuit layer includes a plurality of photoelectric conversion units;
the circuit of the second circuit layer includes a plurality of A/D conversion units that perform A/D conversion on signals based upon the charges generated by the plurality of photoelectric conversion units and output digital signals;
the fourth circuit layer comprises a plurality of calculation units that perform respective calculation processing upon the digital signals outputted from the plurality of A/D conversion units; and
the third circuit layer comprises a plurality of control units that respectively control the plurality of calculation units.

13. The image sensor according to claim 1, wherein:
the circuit of the second circuit layer comprises a comparison unit that compares a signal based upon charge generated by the photoelectric conversion unit with a reference signal;
the third circuit layer comprises a first storage unit that stores a first signal, among signals generated based upon a signal outputted from the comparison unit; and
the fourth circuit layer comprises a second storage unit that stores a second signal, among signals generated based upon the signal outputted from the comparison unit.

14. The image sensor according to claim 1, wherein:
the circuit of the second circuit layer includes a comparison unit that compares a signal based upon charge generated by the photoelectric conversion unit with a reference signal;
the third circuit layer includes a third capacitor for generating the reference signal; and
the fourth circuit layer includes a fourth capacitor for generating the reference signal.

15. The image sensor according to claim 14, wherein the third capacitor is a capacitor whose capacitance value is smaller than that of the fourth capacitor.

16. An image capture device, comprising:
the image sensor according to claim 1; and
an image generation unit that generates image data based upon a signal from the image sensor.

17. The image sensor according to claim 1, wherein the first connection portions electrically connect the wiring of the first circuit layer and the wiring of the second circuit layer;
the second connection portions electrically connect the through electrode of the second circuit layer and the through electrode of the third circuit layer; and
the third connection portions electrically connect the wiring of the third circuit layer and the wiring of the fourth circuit layer.

18. The image sensor according to claim 1, wherein:
the circuit of the second circuit layer comprises an A/D conversion unit that performs AD conversion on a signal based upon the charge generated by the photoelectric conversion unit to output a digital signal;
the third circuit layer comprises a storage unit that stores the digital signal; and
the fourth circuit layer comprises a calculation unit that performs calculation processing upon the digital signal.

19. An image sensor, comprising:
a first circuit layer including a first semiconductor substrate provided with a photoelectric conversion unit that photoelectrically converts light and generates a charge, and a first wiring layer provided with wiring that transmits a signal based upon the charge generated by the photoelectric conversion unit;
a second circuit layer including a second wiring layer provided with a wiring that is connected to the wiring of the first wiring layer and transmits the signal transmitted from the wiring of the first wiring layer, and a second semiconductor substrate provided with a circuit that is connected to the wiring of the second wiring layer and processes the signal transmitted from the wiring of the second wiring layer and a through electrode that transmits the signal processed by the circuit; and
a third circuit layer including a third semiconductor substrate provided with a through electrode connected to the through electrode of the second circuit layer, and a third wiring layer provided with a wiring connected to the through electrode of the third semiconductor substrate;
and wherein the first wiring layer, the first semiconductor substrate, the second semiconductor substrate, the second wiring layer, the third wiring layer, and the third semiconductor substrate are provided in that order from a side upon which the light is incident.

20. An image sensor, comprising:
a first circuit layer including a first semiconductor substrate provided with a photoelectric conversion unit that photoelectrically converts light and generates a charge, and a first wiring layer provided with a wiring that outputs a signal based upon the charge generated by the photoelectric conversion unit;
a second circuit layer including a second wiring layer provided with a wiring connected to the wiring of the first wiring layer, and an A/D conversion unit that performs AD conversion on a signal based upon the charge generated by the photoelectric conversion unit to output a digital signal;
a fourth circuit layer including a fourth semiconductor substrate provided with a calculation unit that performs calculation processing upon the digital signal, and a fourth wiring layer provided with a wiring connected to the calculation unit; and
a third circuit layer including a third semiconductor substrate provided with a control unit that controls the calculation unit, and a third wiring layer provided with a wiring connected to the control unit, wherein:
the first circuit layer, the second circuit layer, the third circuit layer, and the fourth circuit layer are provided in that order from a side upon which the light is incident.

21. An image sensor, comprising:
a first circuit layer including a first semiconductor substrate provided with a photoelectric conversion unit that photoelectrically converts light and generates charge, and a first wiring layer provided with a wiring that transmits a signal based upon the charge generated by the photoelectric conversion unit;

a second circuit layer including a second wiring layer provided with a wiring that is connected to the wiring of the first wiring layer and transmits the signal transmitted from the wiring of the first wiring layer, and a second semiconductor substrate provided with a circuit that is connected to the wiring of the second wiring layer and processes the signal transmitted from the wiring of the second wiring layer and a through electrode that transmits the signal processed by the circuit;

a third circuit layer including a third semiconductor substrate provided with a through electrode connected to the through electrode of the second circuit layer, and a third wiring layer provided with a wiring connected to the through electrode of the third semiconductor substrate;

a fourth circuit layer including a fourth wiring layer provided with a wiring connected to the wiring of the third wiring layer, and a fourth semiconductor substrate connected to the wiring of the fourth wiring layer;

a plurality of first connection portions provided between the first circuit layer and the second circuit layer;

a plurality of second connection portions provided between the second circuit layer and the third circuit layer; and a plurality of third connection portions provided between the third circuit layer and the fourth circuit layer, wherein:

the first circuit layer, the second circuit layer, the third circuit layer, and the fourth circuit layer are provided in that order from a side upon which the light is incident; and the number of the third connection portions is greater than the number of the second connection portions.

* * * * *